US007063478B2

(12) United States Patent
Taniguchi et al.

(10) Patent No.: US 7,063,478 B2
(45) Date of Patent: *Jun. 20, 2006

(54) CRYSTALLIZATION APPARATUS AND CRYSTALLIZATION METHOD

(75) Inventors: Yukio Taniguchi, Yokohama (JP); Masakiyo Matsumura, Yokohama (JP)

(73) Assignee: LCD Technologies Development Center Co., Ltd., Yokohama (JP)

( * ) Notice: Subject to any disclaimer, the term of this patent is extended or adjusted under 35 U.S.C. 154(b) by 211 days.

This patent is subject to a terminal disclaimer.

(21) Appl. No.: 10/692,798

(22) Filed: Oct. 27, 2003

(65) Prior Publication Data
US 2004/0126919 A1 Jul. 1, 2004

(30) Foreign Application Priority Data
Nov. 1, 2002 (JP) ............................. 2002-319267

(51) Int. Cl.
*G01F 9/00* (2006.01)

(52) U.S. Cl. ....................................................... 403/5

(58) Field of Classification Search .................... 430/5; 359/443, 883; 438/166
See application file for complete search history.

(56) References Cited

U.S. PATENT DOCUMENTS

2002/0168577 A1* 11/2002 Yoon .............................. 430/5
2004/0076894 A1* 4/2004 Hwang ........................... 430/5
2004/0126674 A1* 7/2004 Taniguchi et al. ............. 430/5

OTHER PUBLICATIONS

Masakiyo Matsumura, "Preparation of Ultra-Large Grain Silicon Thin-Films by Excimer-Laser", Surface Science, vol. 21, No. 5, 2000, pp. 278-287.
Mitsuru Nakata, et al., "A New Nucleation-Site-Control Excimer-Laser-Crystallization Method", The Japan Society of Applied Physics, vol. 40, Part 1, No. 5A, May 2001, pp. 3049-3054.

* cited by examiner

*Primary Examiner*—S. Rosasco
(74) *Attorney, Agent, or Firm*—Oblon, Spivak, McClelland, Maier & Neustadt, P.C.

(57) ABSTRACT

A crystallization apparatus includes a mask and an illumination system which illuminates the mask with a light beam, the light beam from the illumination system becoming a light beam having a light intensity distribution with an inverse peak pattern when transmitted through the mask, and irradiating a polycrystal semiconductor film or an amorphous semiconductor film, thereby generating a crystallized semiconductor film. The mask includes a light absorption layer having light absorption characteristics according to the light intensity distribution with the inverse peak pattern.

44 Claims, 16 Drawing Sheets

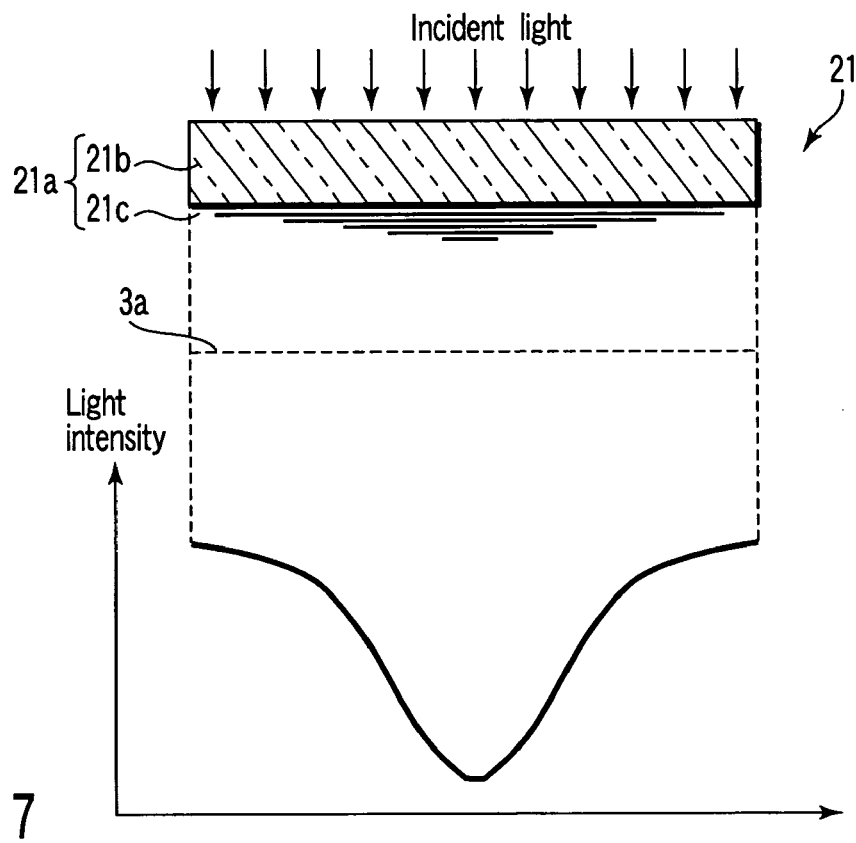
F I G. 7
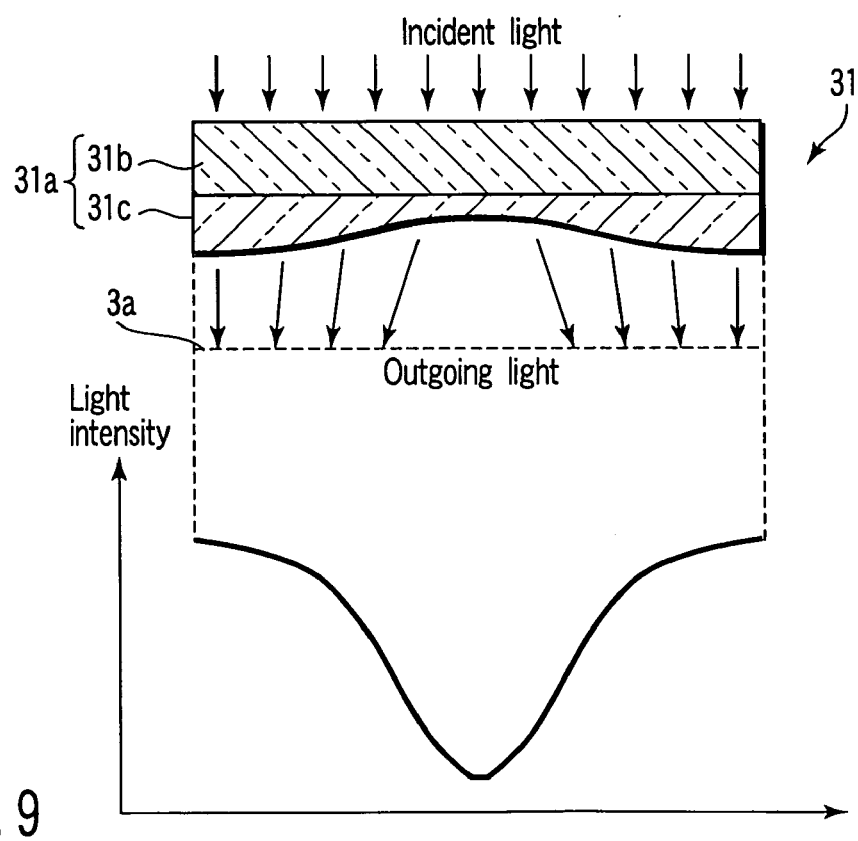
F I G. 9

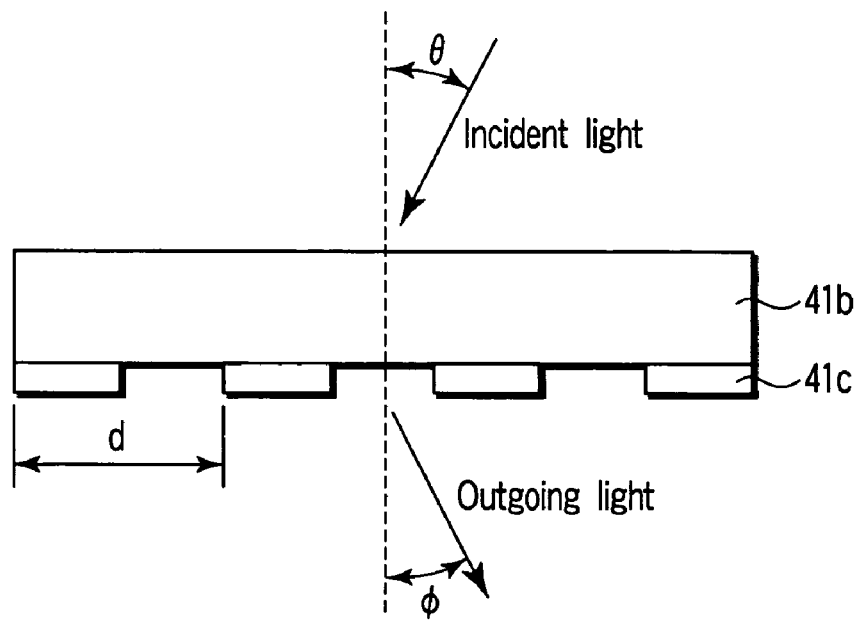
F I G. 12
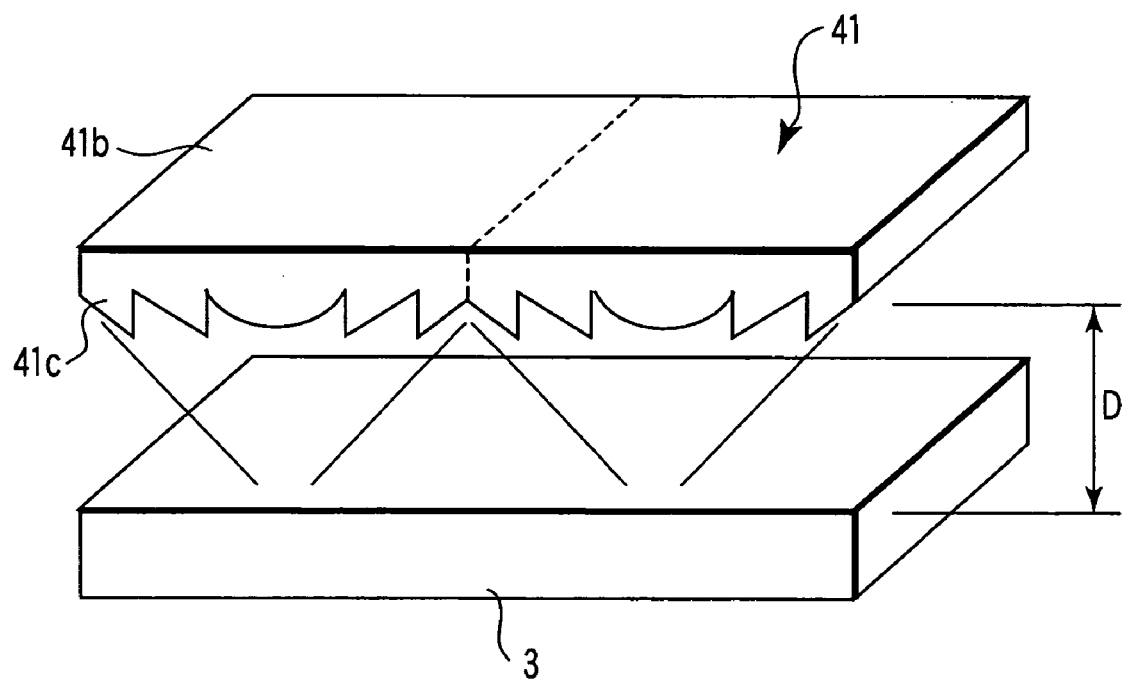
F I G. 13

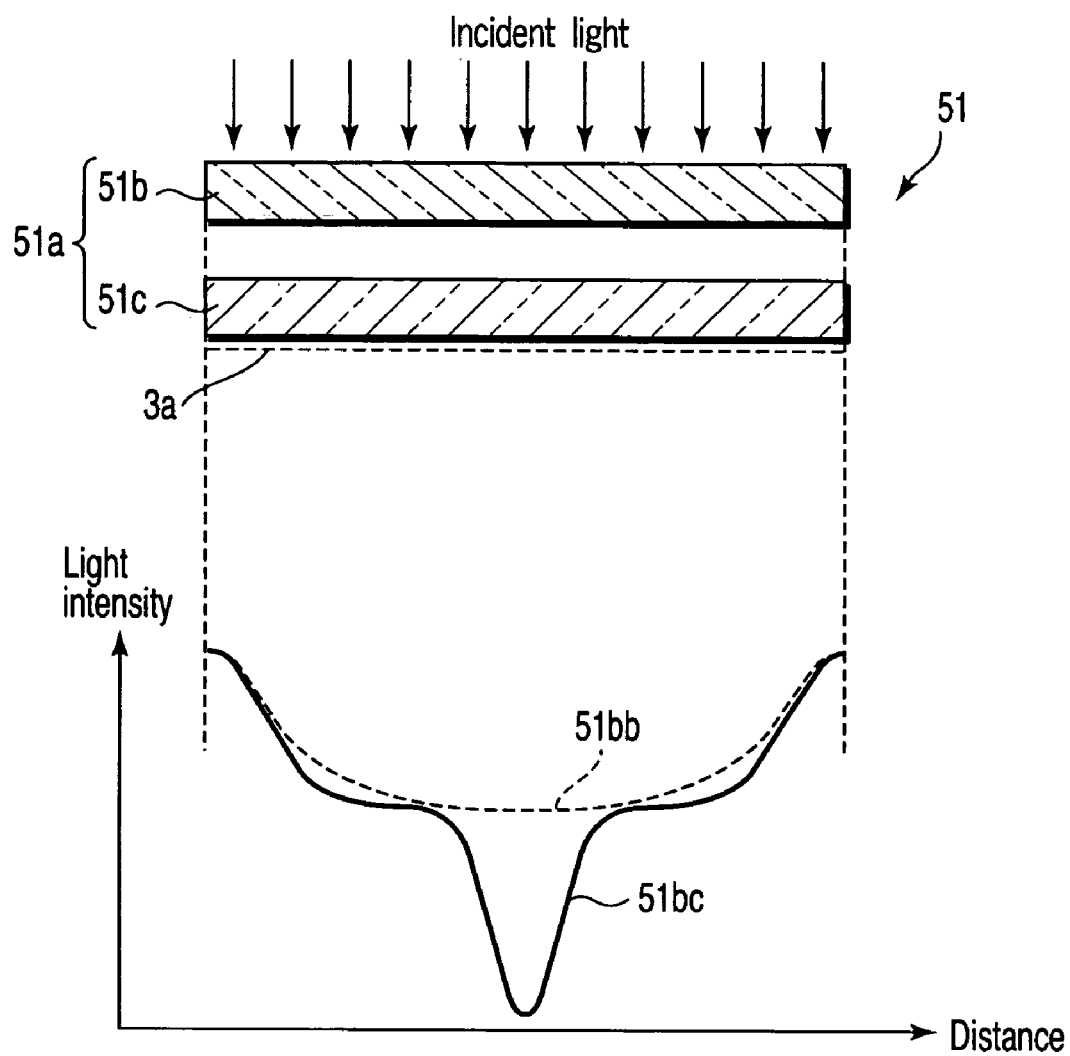
F I G. 17
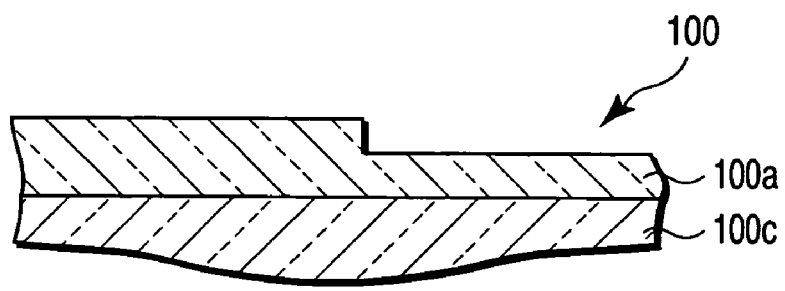
F I G. 17A

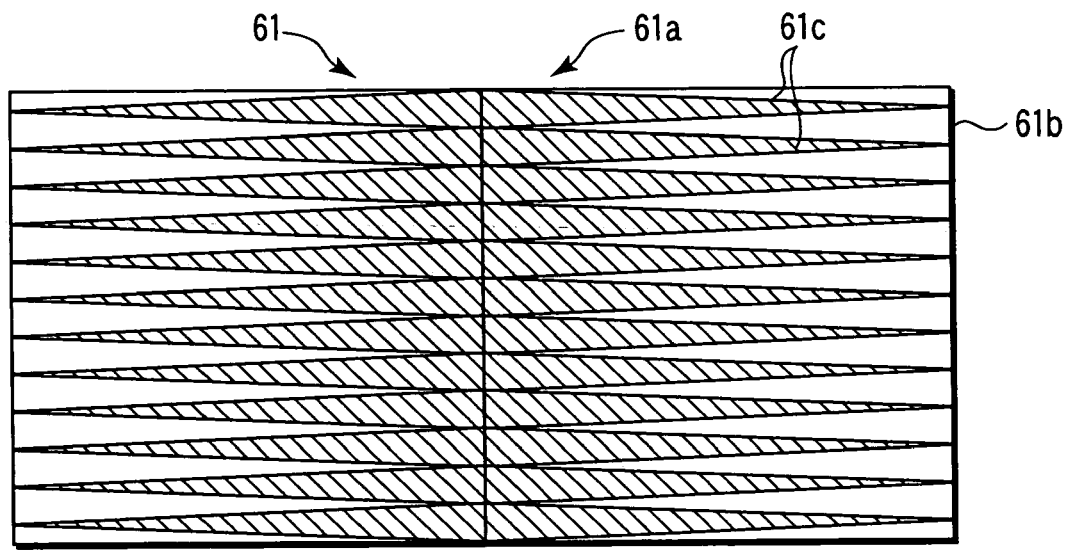
F I G. 20

US 7,063,478 B2

CRYSTALLIZATION APPARATUS AND CRYSTALLIZATION METHOD

CROSS-REFERENCE TO RELATED APPLICATIONS

This application is based upon and claims the benefit of priority from the prior Japanese Patent Application No. 2002-319267, filed Nov. 1, 2002, the entire contents of which are incorporated herein by reference.

BACKGROUND OF THE INVENTION

1. Field of the Invention

The present invention relates to a crystallization apparatus and a crystallization method of semiconductor, and more particularly to an apparatus, a method, a mask and others for generating a crystallized semiconductor film by irradiating a polycrystal semiconductor film or an amorphous semiconductor film with a laser beam through a mask.

2. Description of the Related Art

Materials of a thin film transistor (TFT) used for a switching element or the like which controls a voltage to be applied to pixels of, e.g., a liquid crystal display (LCD) are conventionally roughly divided into amorphous silicon and polysilicon.

The polysilicon has higher electron mobility than that of the amorphous silicon. Therefore, when a transistor is formed by using the polycrystal silicon, a switching speed is increased as compared with a case using the amorphous silicon, and a response speed of a display is also increased. Further, such a transistor can be used as a thin film transistor of a peripheral LSI. Furthermore, using such a transistor can obtain advantages such as a reduction in design margin of any other components.

In case of incorporating peripheral circuits such as a driver circuit or a DAC other than a display main body into a display, constituting these peripheral circuits by the transistors enables an operation at a higher speed.

The polycrystal silicon consists of a number of crystal grains, and it has lower electron mobility than that of monocrystal silicon or crystallized silicon. Moreover, in a small transistor formed by using the polysilicon, irregularities in a crystal grain boundary number at a channel portion are a problem. Thus, in recent years, there has been proposed a crystallization method which generates monocrystal silicon with a large particle diameter in order to improve the electron mobility and reduce irregularities in a crystal grain boundary number at the channel portion.

As this type of crystallization method, there is known "phase control ELA (Excimer Laser Annealing)" which generates a crystallized semiconductor film by irradiating a phase shift mask neighboring a polycrystal semiconductor film or an amorphous semiconductor film in parallel with an excimer laser beam. The detail of the phase control ELA is disclosed in, e.g., "Surface Science Vol. 21, No. 5, pp. 278–287, 2000".

In the phase control ELA, the phase shift mask generates a light intensity distribution having an inverse peak pattern. In this pattern, a light intensity is minimum or substantially 0 at a point corresponding to a phase shift portion of the phase shift mask (pattern that a light intensity is substantially 0 at the center and it is suddenly increased toward the periphery) is generated. A polycrystal semiconductor film or an amorphous semiconductor film is irradiated with the light having this light intensity distribution with the inverse peak pattern. As a result, a temperature gradient is generated in a fusion area of the semiconductor film in accordance with the light intensity distribution, and a crystal nucleus is formed at a part which is first solidified in accordance with the point where the light intensity is minimum or substantially 0. Then, a crystal grows in a lateral direction (lateral growth) from the crystal nucleus toward the periphery, thereby generating monocrystal grains with a large particle size.

In a prior art, a generally used phase shift mask is a so-called line type phase shift mask constituted by two types of rectangular areas which are alternately repeated along one direction. A phase difference of $\pi$ (180 degrees) is given between the two different-type areas. In this case, as shown in FIG. 22, a boundary 200 between two different-type areas 201 and 202 having different thicknesses or different phases constitutes a phase shift portion. The polycrystal semiconductor film or the amorphous semiconductor film is irradiated with the light which has been transmitted through such a phase shift mask. The irradiated light has a light intensity distribution with an inverse peak pattern portion RP such that a light intensity is substantially 0 or minimum at a position on a line corresponding to the phase shift portion 200 and the light intensity is one-dimensionally increased toward the periphery.

As described above, in the prior art using the line type phase shift mask, a temperature becomes lowest along a line corresponding to the phase shift portion (boundary 200), and a temperature gradient is generated along a direction orthogonal to a line corresponding to the phase shift portion. Further, it is general that the light intensity distribution (curved line) at a middle portion MP between the two adjacent inverse peak pattern portions RP involves irregular undulations (wave-formed distribution such as that an increase and a decrease in the light intensity are repeated).

In this case, it is desirable for the positional control of a crystal nucleus that the crystal nucleus is generated at a position with a large inclination or a position 210 close to a minimum intensity point in the light intensity distribution with the inverse peak pattern portion RP. However the crystal nucleus may be inconveniently generated at a position 220 with the low light intensity (i.e., an undesired position) in the undulations of the middle portion. Furthermore, even if the crystal nucleus is generated at an undesirable position, the lateral growth which has started from the crystal nucleus toward the periphery tends to stop at a part where the light intensity is decreased near the boundary between the inverse peak pattern portion RP and the middle portion MP.

BRIEF SUMMARY OF THE INVENTION

It is an object of the present invention to provide a crystallization apparatus and a crystallization method which can generate a crystal nucleus or nuclei at only a desired position or portions, and realize a sufficient lateral growth from the crystal nucleus, thereby generating a crystallized semiconductor film with a large particle size.

To achieve this aim, according to a first aspect of the present invention, there is provided a crystallization apparatus comprising an illumination system which illuminates a mask and generates a crystallized semiconductor film by irradiating a polycrystal semiconductor film or an amorphous semiconductor film with a light ray having a light intensity distribution with an inverse peak pattern through the mask. The mask includes a light absorption layer having light absorption characteristics according to the light intensity distribution with the inverse peak pattern, a light scattering layer having light scattering characteristics, a light reflection layer having light reflection characteristics, a light refraction layer having light refraction characteristics, and/or a light diffraction layer having light diffraction characteristics.

One of the first layer and the second layer can be substituted by a phase shift layer.

According to a second aspect of the present invention, there is provided a crystallization method which illuminates a mask, and generates a crystallized semiconductor film by irradiating a polycrystal semiconductor film or an amorphous semiconductor film with a light ray having a light intensity distribution with an inverse peak pattern through the mask. The mask includes a light absorption layer having light absorption characteristics according to the light intensity distribution with the inverse peak pattern, a light scattering layer having light scattering characteristics, a light reflection layer having light reflection characteristics, a light refraction layer having light refraction characteristics, and/or a light diffraction layer having light diffraction characteristics.

As described above, in the technique of the aspects according to the present invention, a conformation of a light intensity distribution with an inverse peak pattern obtained on a processed substrate can be entirely controlled by using a mask which can arbitrarily form an intermediate light intensity distribution. Thus, a crystal nucleus can be generated at a desired position, and a sufficient lateral growth from the crystal nucleus can be realized, thereby generating a crystallized semiconductor film with a large particle size.

Objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 7 is a view schematically showing a structure of a basic unit part of a mask according to a second modification and a light intensity distribution of an outgoing light beam from this mask;

FIG. 9 is a view showing a structure of a basic unit part of a mask according to a third modification and a light intensity distribution of an outgoing light beam from this mask;

FIG. 12 is a view illustrating a basic diffraction effect of the mask according to the fourth modification;

FIG. 13 is a view illustrating an example of a manufacturing method of the mask according to the fourth modification and a usage embodiment;

FIG. 17 is a view schematically showing a primary structure and an effect of a crystallization apparatus according to a fifth embodiment of the present invention;

FIG. 17A is a view showing a modification of the mask depicted in FIG. 17;

FIG. 20 is a view illustrating an example of a manufacturing method of a mask having binary distribution characteristics and a usage embodiment;

DETAILED DESCRIPTION OF THE INVENTION

Embodiments according to the present invention will now be described with reference to the accompanying drawings.

Figure 1:
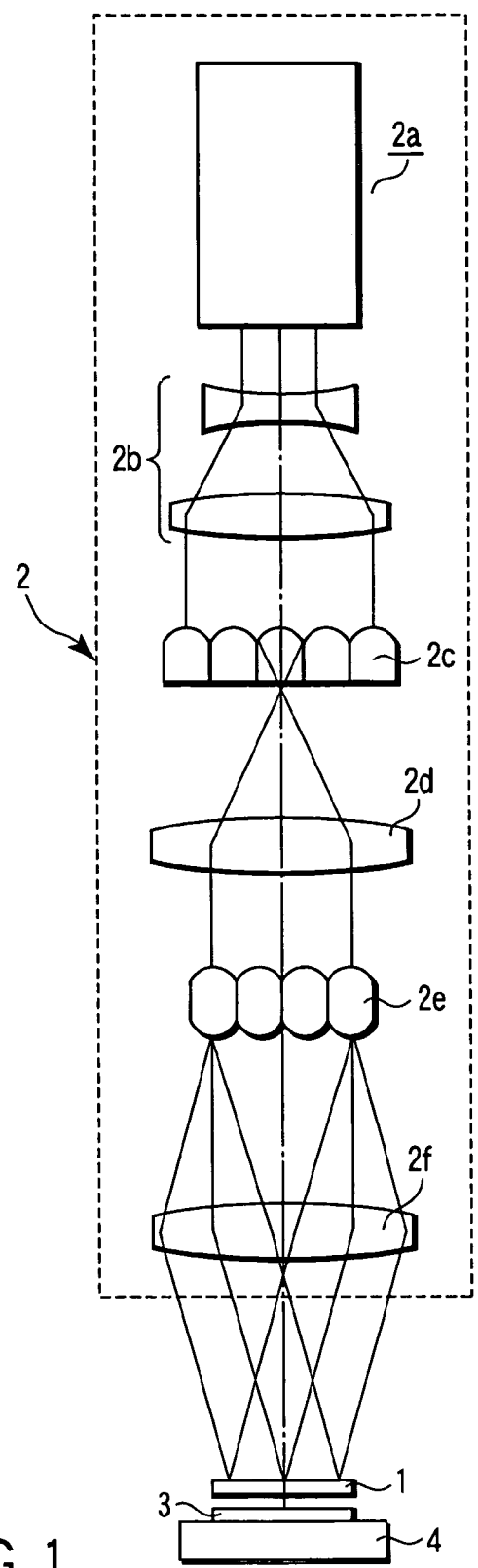
FIG. 1 is a view schematically showing a structure of a crystallization apparatus according to a first embodiment of the present invention.

FIG. 1 is a view schematically showing a structure of a crystallization apparatus according to a first embodiment of the present invention. The crystallization apparatus according to the first embodiment includes an illumination system 2 which illuminates a mask 1. The illumination system 2 includes a KrF excimer laser light source 2a which supplies a laser beam having a wavelength of, e.g., 248 nm. As the light source 2a, it is also possible to use any other appropriate light source such as an XeCl excimer laser light source. The laser beam emitted from the light source 2a is expanded through a beam expander 2b, and then enters a first fly-eye lens 2c.

In this manner, a plurality of small light sources are formed on a rear focal plane of the first fly-eye lens 2c, and light fluxes from the small light sources illuminate an incident plane of a second fly-eye lens 2e through a first condenser optical system 2d in the superimposing manner. As a result, more small light sources than those on the rear focal plane of the first fly-eye lens 2c are formed on a rear focal plane of the second fly-eye lens 2e. Light fluxes from the small light sources formed on the rear focal plane of the second fly-eye lens 2e illuminate a mask 1 through a second condenser optical system 2f in the superimposing manner.

Here, the first fly-eye lens 2c and the first condenser optical system 2d constitute a first homogenizer. An intensity concerning an incident angle of the light onto the mask 1 is homogenized by the first homogenizer. Further, the second fly-eye lens 2e and the second condenser optical system 2f constitute a second homogenizer. An intensity concerning an in-plane position onto the mask 1 is homogenized by the second homogenizer. Therefore, the illumination system 2 irradiates the mask 1 with the light or laser beam having a substantially even light intensity distribution. A substrate 3 processed to be arranged in parallel to and in close proximity to the mask 1 is irradiated with the laser beam which has passed through the mask 1. Here, the processed substrate 3 is obtained by sequentially forming an underlying film and an amorphous silicon film on, e.g., a liquid crystal display flat glass by a chemical vapor deposition method. In other words, the mask 1 is set so as to face the amorphous semiconductor film. The processed substrate 3 is held at a predetermined position on a substrate supporting stage 4 by a vacuum chuck or an electrostatic chuck.

Figure 2:
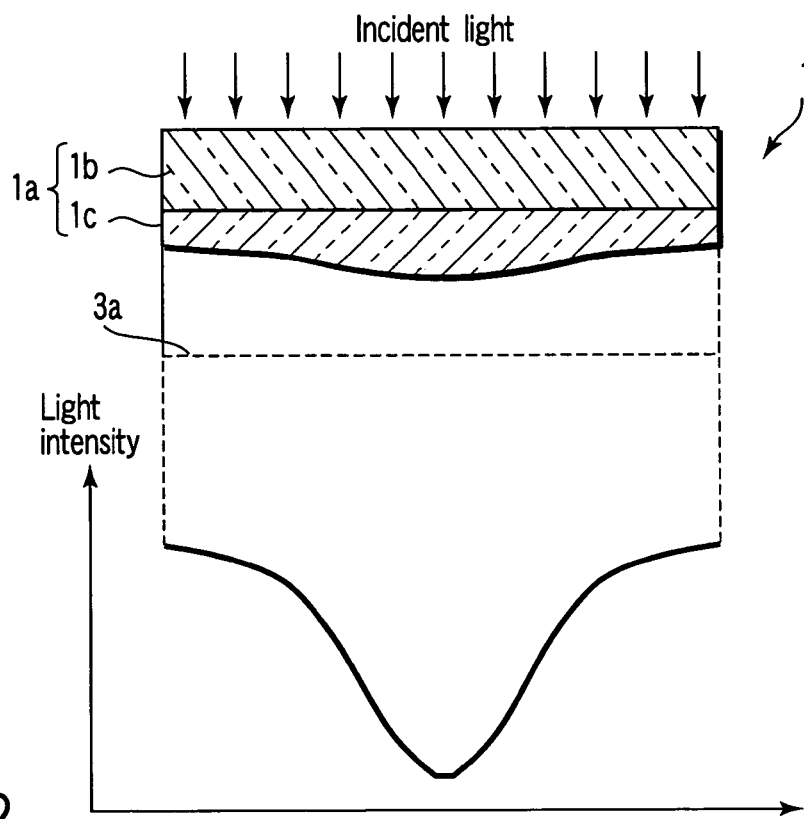
FIG. 2 is a view schematically showing a structure and an effect of a basic unit part of a mask in the first embodiment.

A structure and effect of a basic unit part of the mask in the first embodiment will now be described with reference to FIG. 2. The mask 1 is constituted by a parallel plane type transparent substrate 1b made of a transparent material such as a quartz glass, and a light absorption layer 1c which is made of a predetermined light absorption material and has a predetermined surface shape. The mask has at least one, or generally a plurality of basic unit parts 1a arranged on the same plane, and only one basic unit part 1a is shown in FIG. 2 for clarifying the drawing. It is preferable for the mask 1 to have a conformation that the basic unit parts 1a are actually one-dimensionally repeated along a direction that a transmittance distribution intensity varies (horizontal direction in FIG. 2). That is, a plurality of elongated rectangular areas are aligned in such a manner that long sides of adjacent areas become common in the horizontal direction of one substrate, and a basic unit part 1a is formed in each rectangular area. This point is also true in masks according to the following modifications and embodiments.

As the light absorption material, it is possible to adopt a material which is used in, e.g., a halftone type phase shift mask, i.e., at least one of MoSi, MoSiON, ZrSiO, a-Carbon, SiN/TiN, TiSiN, Cr and others. In order to manufacture the mask 1, a light absorption film consisting of, e.g., ZrSiO is formed with an even thickness on the transparent substrate 1b, and then a resist is applied on a surface of the light absorption film. Then, an electron beam lithography and development processing are applied by continuously changing a doze amount, and a resist film having a continuous curved shape is formed in such a manner that both sides are thin and a center is thick in each basic unit part 1a. Thereafter, the resist film and a surface of the substrate under this film are removed from the resist film side to desired depths, by using a dry etching technique. By such etching, a central part of the light absorption film having the thick resist film thereon is etched so as to be shallower than the both side parts having the thin resist film thereon. As a result, it is possible to obtain the mask 1 including the light absorption layer 1c having a surface with a generally continuous curved shape step-shaped surface such as shown in FIG. 2.

The mask 1 including the light absorption layer 1c having a step-shaped surface (e.g., a surface approximated by, e.g., eight-level steps) may be manufactured by, e.g., repeating formation and patterning of the light absorption film for a plurality of number of times. This technique will be described in detail hereinafter. First, a resist film is applied except both outer side portions with a predetermined width of the light absorption film on each rectangular area of the substrate, and only the both outermost portions are etched with a predetermined width and a predetermined depth by etching after removing the resist film. Then, new resist film is applied to the part of the light absorption film excluding the both etched outermost portions and the outer portions with a predetermined width which are adjacent to the both outermost portions. Subsequently, the outer portion is etched with a predetermined width and a predetermined depth by the similar etching, and the outermost portion is further etched with a depth corresponding to this etching depth. As a result, a step is formed between the outermost portion and the outer portion. In this manner, it is possible to form the light absorption film by performing this process for six times in such a manner that the etching portions gradually shift toward the central portion so as to obtain a convex shape that the center most highly protrudes on eight level steps. This is just an example, and it can be understood that such steps may not be formed and the number of steps is not restricted to eight.

When the mask 1 having such a structure is illuminated with the light or laser beam having a substantially even light intensity distribution by the illumination system 2, the light which has been transmitted through the mask 1 has a light intensity distribution such that a light intensity is minimum at a position corresponding to the center of the convex portion of the light absorption layer 1c on the surface 3a of the processed substrate and the light intensity is monotonously increased toward the periphery, i.e., a light intensity distribution with an inverse peak pattern (or a concave pattern).

As described above, the first embodiment uses the mask 1 including the light absorption layer 1c having light absorption characteristics according to a desired light intensity distribution with an inverse peak pattern. Thus, a conformation of the light intensity distribution obtained on the processed substrate 3 can be entirely controlled, and it is possible to obtain a light intensity distribution that a light intensity is monotonously increased from the center toward the periphery as indicated by a curved line in FIG. 2. The processed substrate irradiated the light having such a light intensity distribution is heated according the light intensity distribution. The temperature of the heated portion of the substrate becomes higher than a melting temperature of the substrate to growth a crystal nucleus. The minimum light intensity of the light may be set to heat an irradiated portion of the substrate at a temperature lower or higher than the melting temperature, or equal thereto. The light having such a light intensity distribution is irradiation in a pulse manner while shifting the substrate. As a result, a crystal nucleus or nuclei can be generated at a position where an inclination is large at a substantial center in the light intensity distribution with the inverse peak pattern (i.e., a desired position), and there is no part where the light intensity is decreased in a middle part MP between adjacent inverse peak patterns RP, as different from the prior art. Thus, a growth of a large crystal is realized without preventing a lateral growth from stopping in mid course. In such a case, a maximum protrusion portion of the light absorption film 1c, which is a central portion of each basic unit part 1a in this embodiment in such a mask 1a is accurately positioned on the transparent substrate 1b, and hence a crystal nucleus (nuclei) can be generated at a desired position (portions) of the processed substrate 3a by accurately positioning the mask 1a and the processed substrate 3. Further, a sufficient lateral growth from the crystal nucleus can be realized, thereby generating a crystallized semiconductor film with a large particle size.

Figure 3:
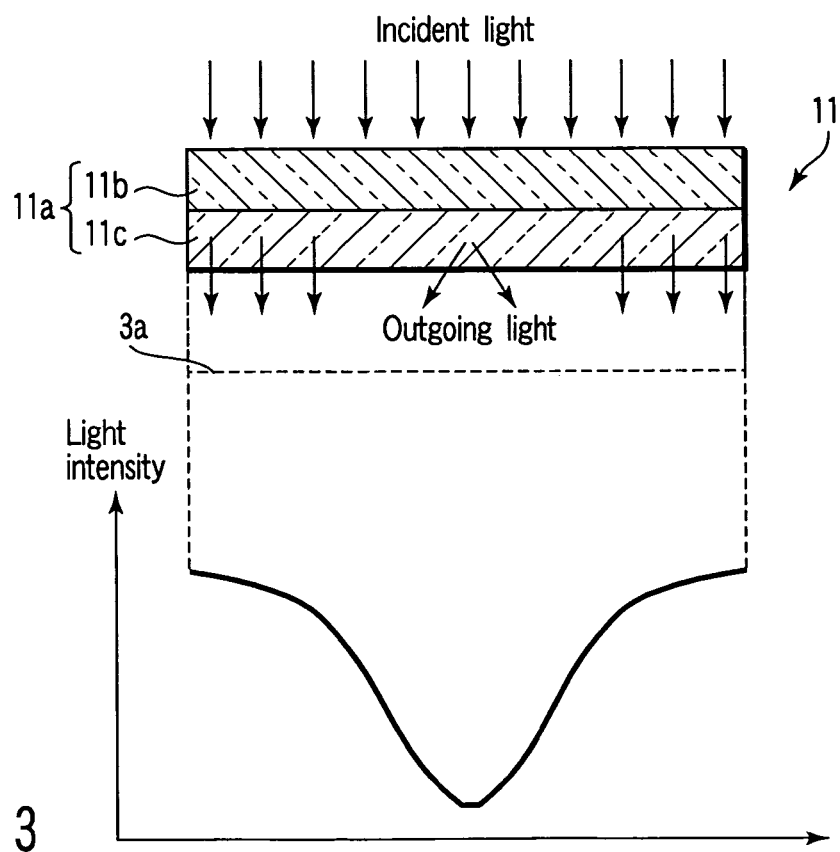
FIG. 3 is a view schematically showing a structure of a basic unit part of a mask according to a first modification and a light intensity distribution of an outgoing light beam from this mask.

A mask according to a first modification will now be described with reference to FIGS. 3 and 4. In the following explanation, since a material and a shape of the transparent substrate and a relationship between the basic unit part and the mask are the same as those in the first embodiment unless otherwise stated, the detailed description will be eliminated. Referring to FIG. 3, a basic unit part 11a of a mask 11 according to the first modification is constituted by a transparent substrate 11b and a light scattering layer 11c, the lager 11c is attached to one surface of the transparent substrate 11b and has light scattering characteristics according to a desired light intensity distribution with an inverse peak pattern. The light scattering layer 11c can be constituted by, e.g., forming fine roughness (surface relief) of a wavelength order of an illumination light ray on a light incident plane and/or a light outgoing radiation plane of a transparent layer, or forming a predetermined fine refractive index distribution in the transparent layer along the transparent layer.

Figure 4:
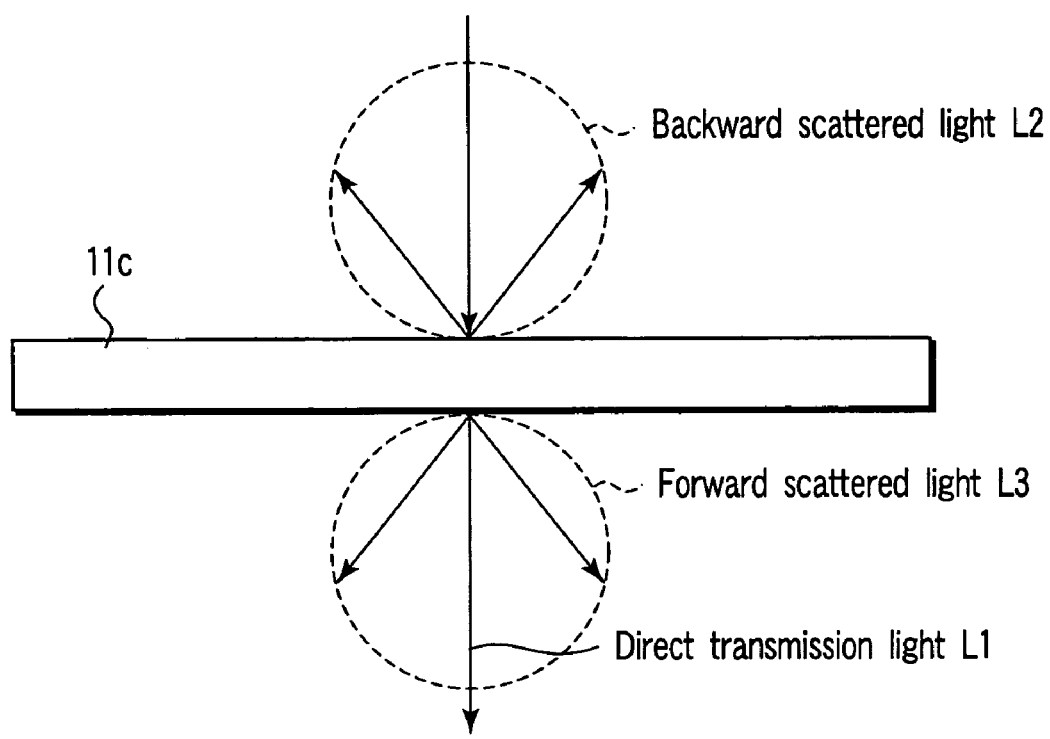
FIG. 4 is a view illustrating an effect of light scattering layer of the mask depicted in FIG. 3.

When the light enters the light scattering layer 11c, there are generated light rays (direct transmission light) L1 which are directly transmitted without being scattered, light rays (backward scattered light) L2 which are scattered backwards, and light rays (forward scattered light) L3 which are scattered forwards as shown in FIG. 4. Although FIG. 4 illustrates that the backward scattered light L2 outgoes from the light incident plane and the forward scattered light L3 outgoes from the light outgoing radiation plane, positions from which the scattered light is emitted are not restricted thereto. It can be readily understood that such positions depend on a structure of the scattering layer. When using such a mask, there is a possibility that the forward scattered light L3 reaches a surface 3a of the processed substrate and becomes a noise. In such a case, however, by assuring a fixed gap between the mask 11 and the processed substrate 3, an intensity distribution of the forward scattered light which reaches the surface 3a becomes substantially even, and hence this light does not become a noise.

In this manner, basically, the light intensity distribution of the direction transmission light of the mask according to the first modification corresponds to the light intensity distribution formed on the surface 3a of the processed substrate 3.

Figure 5:
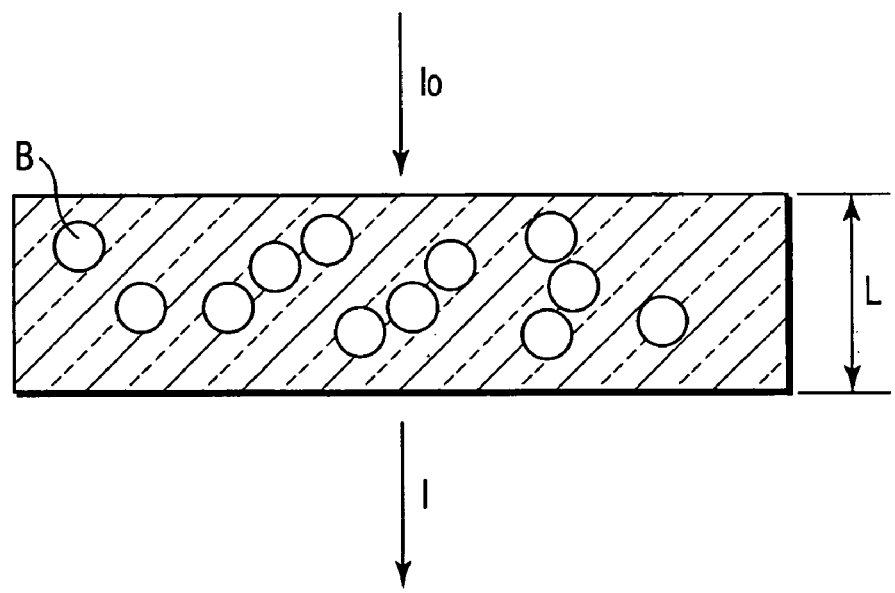
FIG. 5 is a view basically illustrating scattering of the light.

Referring to FIG. 5, a basic description will be given as to scattering of the light. Generally, scattering due to particles b (for example, air gaps as described later) having a diameter a which is approximately a wavelength of the incident light can be calculated by a Mie scattering theory. Referring to FIG. 5, an intensity I after a parallel beam with an intensity $I_0$ has passed through a substance with a thickness L, having particles b therein can be represented by the following expression (1). In the expression (1), σ is a light intensity attenuation coefficient, and can be represented by the following expression (2).

$$I = I_0 e^{-\sigma L} \quad (1)$$

$$\sigma = NK\pi a^2 \quad (2)$$

Here, N is the number of particles per unit cubic volume, and a is a radius of the particle b. Furthermore, K is a scattering efficiency of the particle, and is a value which can be calculated by the Mie scattering theory. When the radius a of the particle is not less than a wavelength, a value of K is approximately 4 to 2. As an example, assuming that the radius a of the particle b is 0.39 μm, the particle number N per unit cubic volume is 0.24/μm³ and the scattering efficiency K of the particle b is 2.0 (approximation), the attenuation coefficient σ is 0.23/μm. Therefore, the light intensity I after transmitted through a film with a thickness L=10 μm in which the particles are distributed with a density of N is $I=I_0 e^{-\sigma L}=0.1 \times I_0$, and becomes a light intensity which is 1/10 of the intensity $I_0$ of the incident light.

In this manner, the distribution of the light intensity can be controlled by appropriately selecting the attenuation coefficient σ according to the expression (1) so as to differ depending on each position, or by changing thickness L of parts of a material (basic layer) and appropriately distributing them. Although the attenuation coefficient σ can be increased as the radius a of the particle becomes large, the forward scattered light is increased as compared with the backward scattered light and a scattered light component (=noise) which reaches the substrate 3 is also increased. Therefore, the design must be carried out taking this point into consideration.

An example of a manufacturing method of the mask according to the first modification and a usage embodiment will now be described with reference to FIGS. 6A to 6E.

Each of the particles b described above may be formed by any material and/or in any shape each as spherical, rectangular or irregular shape.

Figure 6A:
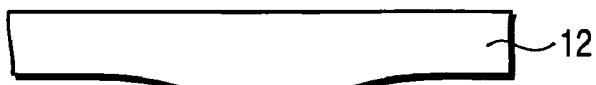
FIGS. 6A to 6E are views illustrating an example of a manufacturing method of the mask according to the first modification and a usage embodiment.
Figure 6B:
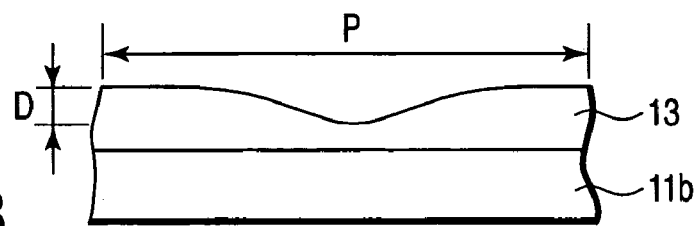
Figure 6C:
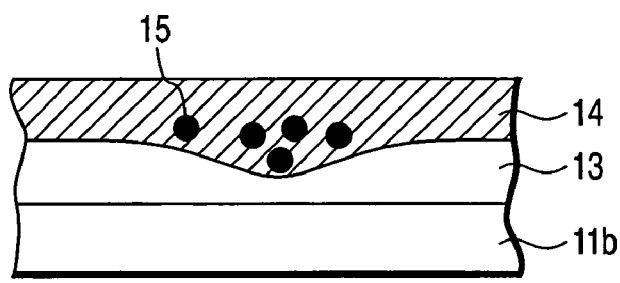

A resin layer 13 having a roughness surface or ridges and recesses was formed on the quartz glass substrate 11b as a base material as shown in FIG. 6B by resin molding using a die 12 depicted in FIG. 6A. The die 12 is an original plate formed by applying mechanical cutting processing to an Ni plate. Here, it was determined that a pitch P of ridges is 10 μm and a depth D of the recess is 5 μm. An organic SOG film (spin-on glass, e.g., a material obtained by, e.g., substituting alkoxysilane by alkyl) 14 having a flat upper face was formed on the resin 13 with the irregular shape by spin coating as shown in FIG. 6C after adding xylene 15 as a volatile matter which does not have a compatibility with this material.

Figure 6D:
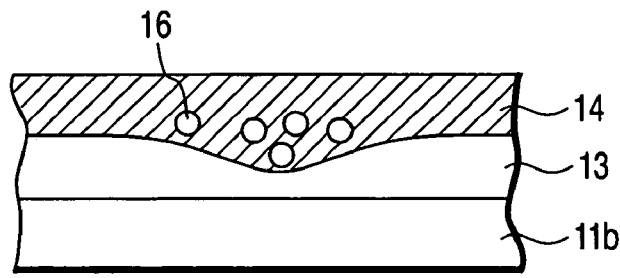
Figure 6E:
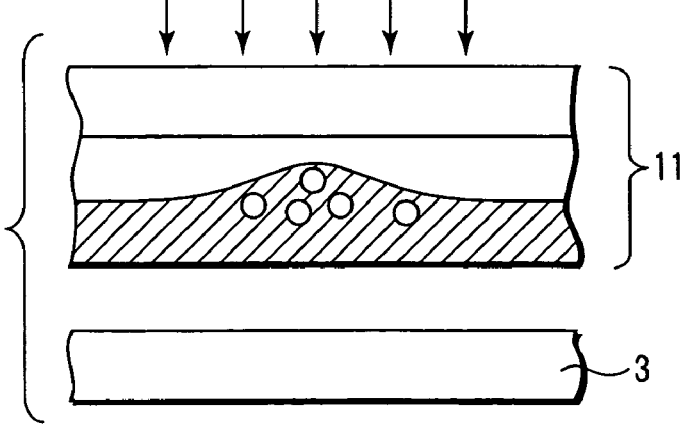

Subsequently, by volatilizing the volatile matter 15 by drying, fine air gaps 16 having an average radius of approximately 0.4 μm were generated in the organic SOG film as shown in FIG. 6D. At this time, since the surface of the SOG film 14 is flat, a film thickness distribution of the SOG film 14 depends on a layer thickness distribution of the resin mold layer 13, and a thickest part of the SOG film 14 was set to be approximately 10 μm in this example. A refractive index of the SOG film 14 is approximately 1.5, and a refractive index of the air gap (air) 16 is 1. A difference in refractive index provokes scattering. The thus manufactured mask 11 was held at a position away from the processed substrate 3 by 20 μm, and the mask 11 was illuminated with an XeCl excimer laser beam (wavelength: 308 nm) from a substantially vertical direction. As a result, a desired light intensity distribution with an inverse peak pattern (concave pattern) was able to be formed, the a crystal with a large particle size can be generated. At this time, although the forward scattered light was generated, it became substantially even on the surface of the processed substrate, and its influence was able to be ignored.

A basic unit part of a mask according to a second modification will now be described with reference to FIG. 7. A basic unit part 21a of a mask 21 is constituted by a transparent substrate 21b, and a light reflection layer 21c which is formed on a light outgoing radiation plane of the substrate 21b and has light reflection characteristics according to a desired light intensity distribution with an inverse peak pattern. The light reflection layer 21c is constituted as a multilayer reflection film formed according to a desired layer number distribution.

Since the multilayer reflection film has a structure in which dielectric substances with different refractive indices are alternately laminated and basically does not absorb the light, a value obtained by subtracting 1 from the refractive index is a transmittance. Therefore, a reflection factor is large (transmittance is small) in a part where the number of layers is large, and the reflection factor is small (transmittance is large) in a part where the number of layers is small. However, it is desirable to obtain a relationship between the number of layers in the multilayer reflection film and a value of the reflection factor by a rigid calculation in accordance with a desired light intensity pattern.

The light reflection layer 21c can be constituted as a metal reflection film formed in accordance with a predetermined thickness distribution. In this case, however, a thickness distribution must be controlled in an extremely thin metal reflection film.

Figure 8A:
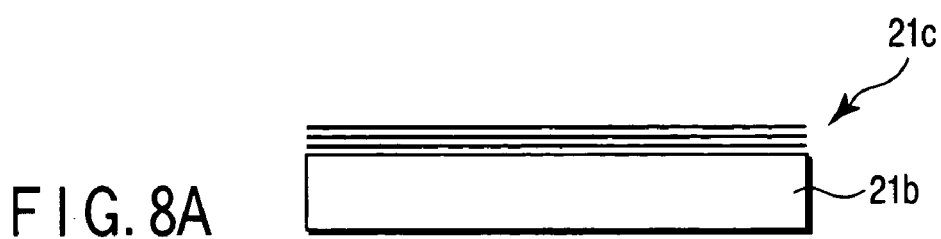
FIGS. 8A to 8E are views illustrating a manufacture embodiment of the mask according to the second modification and a usage embodiment.
Figure 8B:
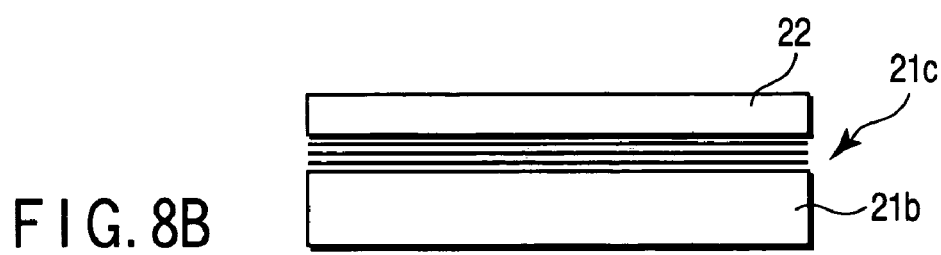
Figure 8C:
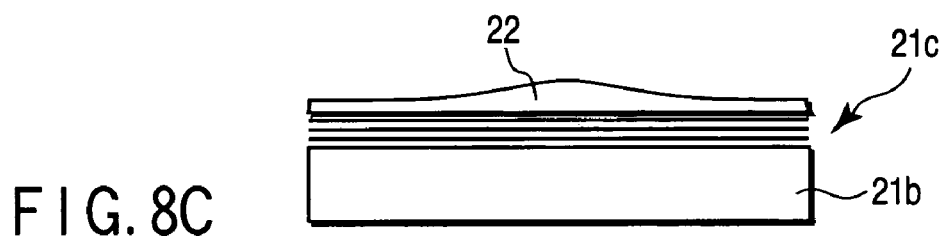
Figure 8D:
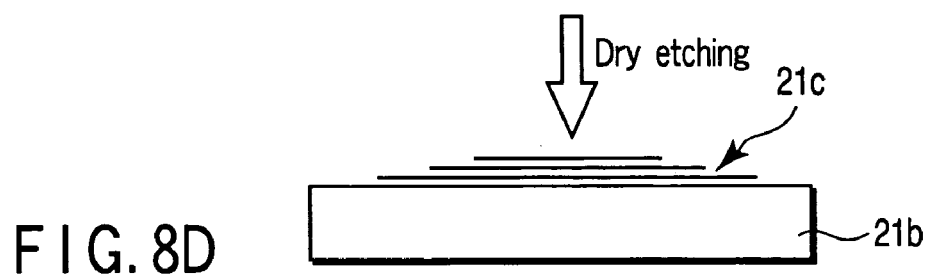
Figure 8E:
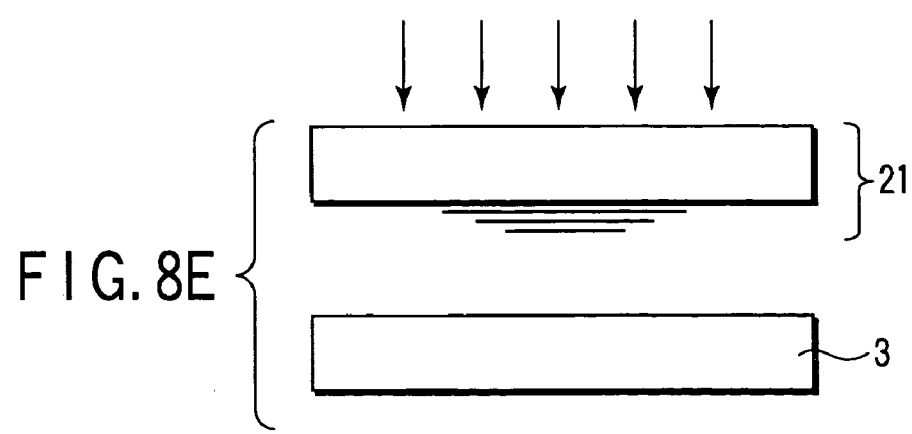

An example of a manufacturing method of the mask according to the second modification and a usage embodiment will now be described with reference to FIGS. 8A to 8E. As shown in FIG. 8A, a multilayer reflection film 21c consisting of $MgF_2$ layers and ZnS layers was formed by alternately evaporating $MgF_2$ and ZnS on the quartz glass substrate 21b as a base material of the mask. Then, as shown in FIG. 8B, an electron beam resist 22 was spin-coated on the multilayer reflection film 21c. Thereafter, as shown in FIG. 8C, by performing irradiation and development while continuously changing a doze amount (irradiation quantity) by using an electron beam lithography device, a resist film 22 with an irregular or roughness corresponding to the desired light intensity distribution shape was obtained. Subsequently, a multilayer reflection film 21c having a predetermined layer number distribution and corresponding to the shape of the resist film 22 as show FIG. 8C was obtained as shown in FIG. 8D by performing dry etching to the resist film 22 and the multilayer reflection film 21c. Here, a part with a large layer number, i.e., a central portion has a high reflection factor, i.e., a low transmittance. On the contrary, parts with a small layer number, i.e., both side portions have a low reflection factor, i.e., a high transmittance. Parts between the central portion and the side portions have a transmittance which is gradually increased toward the side portion. The thus manufactured mask 21 was held at a position away from the processed substrate 3 by 20 μm, and the mask 21 was illuminated with an XeCl excimer laser beam (wavelength 308 nm) from a substantially vertical direction as indicated by an arrow (FIG. 8E). As a result, a desired light intensity distribution with an inverse peak pattern (concave pattern) was formed, thereby generating a crystal with a large particle size.

A structure and an effect of a basic unit part of a mask according to a modification will now be described with reference to FIG. 9. A basic unit part 31a of a mask 31 according to a third modification is constituted by a transparent substrate 31b, and a light refraction layer 31c which is attached to an outgoing radiation plane of the substrate 31b and has light refraction characteristics according to a desired light intensity distribution with an inverse peak pattern. The light refraction layer 31c can be constituted by, e.g., forming a surface of the transparent layer into a desired curved shape or forming a desired refractive index distribution in the transparent layer.

In order to manufacture the mask 31 according to the third modification, a resist is applied on a surface of, e.g., a quartz glass substrate as the transparent layer, and an electron beam lithography and development processing are applied while continuously or discontinuously changing a doze amount, thereby generating a resist film having a continuously or discontinuously curved surface. Thereafter, the mask 31 having a refraction plane with a continuously curved or stepwise surface can be obtained by using a dry etching technique. For example, by repeating formation and patterning of the resist film for a plurality of number of times, the mask 31 having a refraction plane with a step-like shape can be obtained. Since the above technique has been described when forming the mask shown in FIG. 2, the detailed explanation will be eliminated.

Figure 10:
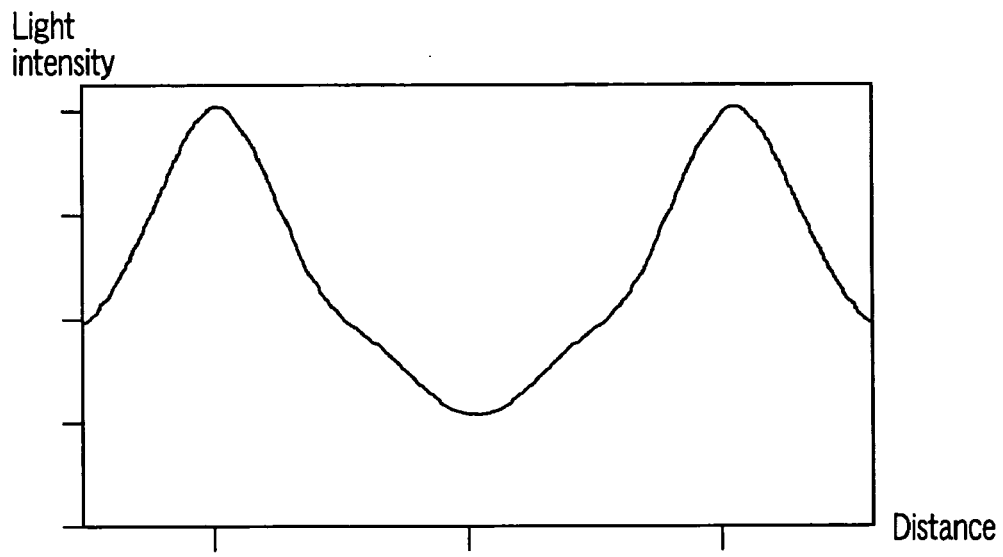
FIG. 10 is a view showing a simulation result concerning a light intensity distribution obtained when a refraction surface of the mask according to the third modification is formed into a step-like shape.

FIG. 10 is a view showing a simulation result concerning a light intensity distribution which can be obtained when using a mask that a refraction plane according to the third modification is formed into a step-like shape (formed by the latter manufacturing method). In this simulation, the refraction plane of the mask 31 according to the third modification is approximated by eight level steps that a phase difference corresponds to 22.5 degrees to 180 degrees. Moreover, a numerical aperture of the illumination system 2 is set to 0.025, and a light intensity distribution on the processed substrate 3 arranged away from the mask 31 by 40 μm is obtained by a calculation. As shown in FIG. 10, even if the refraction surface of the mask 31 is approximated on multiple stages, it can be considered that a desired light intensity distribution with an inverse peak pattern (concave pattern) can be obtained as a whole.

Figure 11:
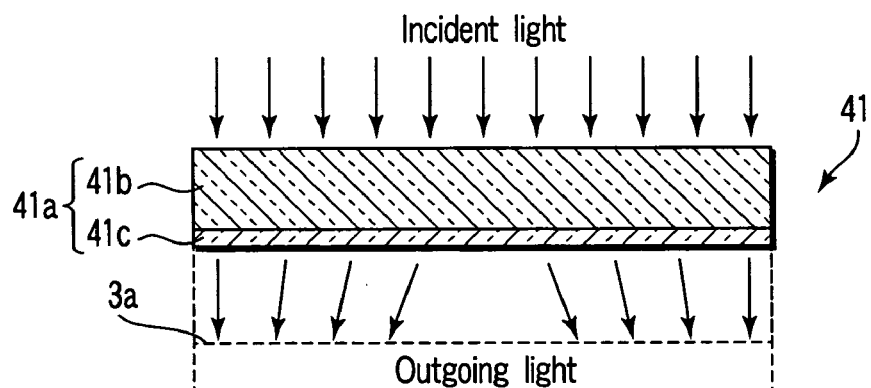
FIG. 11 is a view schematically showing a structure of a basic unit part of a mask according to a fourth modification and a light intensity distribution of an outgoing light beam from this mask.
Figure 11:
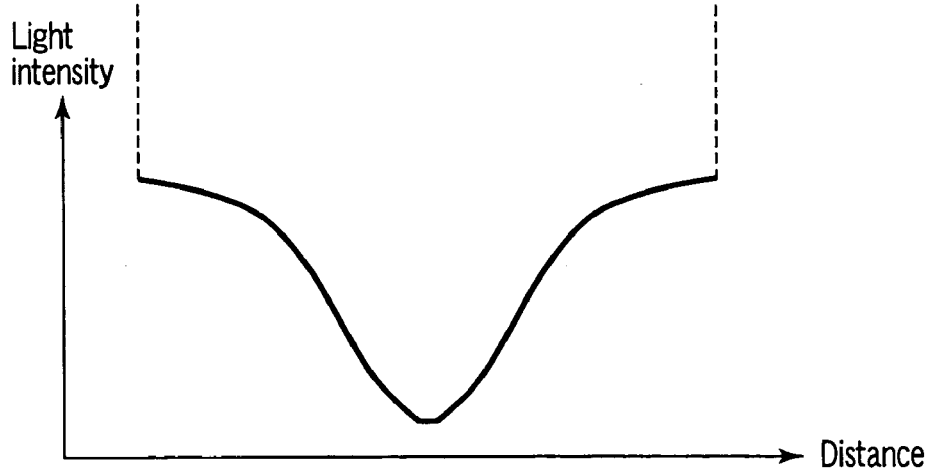

A structure and an effect of a basic unit part of a mask according to a fourth modification will now be described with reference to FIG. 11. A basic unit part 41a of a mask 41 according to the fourth modification is constituted by a transparent substrate 41b, and a light diffraction layer 41c which is attached or integrally formed to at least one plane of this substrate, which is a light outgoing radiation plane in this example, and has light diffraction characteristics according to a desired light intensity distribution with an inverse peak pattern. The light diffraction layer 41c can be constituted by, e.g., forming at least one plane of the transparent layer into a necessary shape, or forming a predetermined refractive index distribution or a light absorption factor distribution in the transparent layer. In order to realize a mask with a high diffraction efficiency (light utilization efficiency), a technique which forms the surface into a necessary shape or a technique which forms a refractive index distribution inside is more preferable than a technique which forms the light absorption factor distribution inside.

The light diffraction layer 41c is realized as a so-called diffraction grating (or a hologram). In the mask 41 according to the fourth modification, the light is diffracted by the diffraction grating (or the hologram), and a necessary light intensity distribution is formed on the surface 3a of the processed substrate away by a predetermined distance. In this case, as the diffraction grating (or the hologram), one having one type of interference fringe provided thereto or one having a plurality of interference fringes superimposed thereon may be adopted. Additionally, the diffraction grating is classified into a non-scattering type that there is no scattering on a mask surface and a scattering type that there is scattering on a mask surface depending on presence/absence of a scattering function on the mask surface. A brief description will now be given as to the non-scattering type that there is not scattering on the mask surface, i.e., a case that one type of interference fringe is provided.

FIG. 12 is a view schematically illustrating a basic diffraction effect of the mask according to the fourth modification. The light, which has entered with an incident angle θ the diffraction grating (or the hologram) with a cycle d formed on the mask surface, undergoes the diffraction effect and is caused to outgo with an outgoing radiation angle φ. Here, a relationship between the incident angle θ and the outgoing radiation angle φ can be represented by the following expression (3) of the diffraction.

$$\sin\theta + \sin\phi = m\lambda/d \quad (3)$$

In the expression (3), m is a diffraction order, and λ is a wavelength of the light. In the fourth modification, it is good enough to obtain a pitch d and a direction of the diffraction grating on the mask surface by making reference to the expression (3) in such a manner that a desired light intensity distribution can be obtained on the surface $3a$ of the processed substrate 3 separated by a predetermined distance.

An example of a manufacturing method of the mask according to the fourth modification and a usage embodiment will now be described with reference to FIG. 13. In the mask 41 according to the fourth modification, a braze type diffraction grating such as shown in FIG. 13 was formed as the light diffraction layer $41c$ on one surface of the transparent substrate $41b$ by the same method as that of the second modification (however, the quartz glass substrate was etched in place of the multilayer reflection film). This type of diffraction grating is called a hologram optical element or a diffraction optical element and has come into practical use. This diffraction grating has a pitch which varies in a one-dimensional direction, and has a function to linearly condense the light onto its focal position. The manufactured non-scattering type (one type of interference fringe) mask 41 was held at a position away from the processed substrate 3 by a focal distance D so as to face this substrate then, the mask 41 was illuminated with an XeCl excimer laser beam (wavelength: 308 nm) in a non-parallel light beam (scattered light flux) having a predetermined maximum incident angle from a substantially vertical direction.

As a result, a desired light intensity distribution with an inverse peak pattern (concave pattern) was formed, thereby generating a crystal with a large particle size. Such a diffraction type mask can be manufactured by hologram type exposure. In this case, it is good enough to generate a linear object light beam by using optical means such as a slit or a cylindrical lens, and record an interference fringe of the linear object light and a reference light beam onto a hologram sensitive material. Even if the hologram type recording method is used or the manufacturing method based on the above calculation is used, both the scattering type and non-scattering type conformations can be realized.

It is to be noted that the basic unit part of the mask forms the one-dimensional light intensity distribution and the mask has a conformation that the basic unit part is one-dimensionally repeated along a direction of the light intensity distribution in the above-described embodiment and modifications. However, the present invention is not restricted thereto, the basic unit part of the mask can form a two-dimensional light intensity distribution and the mask can have a conformation that the basic unit part is two-dimensionally repeated along a direction of the light intensity distribution.

Figure 14:
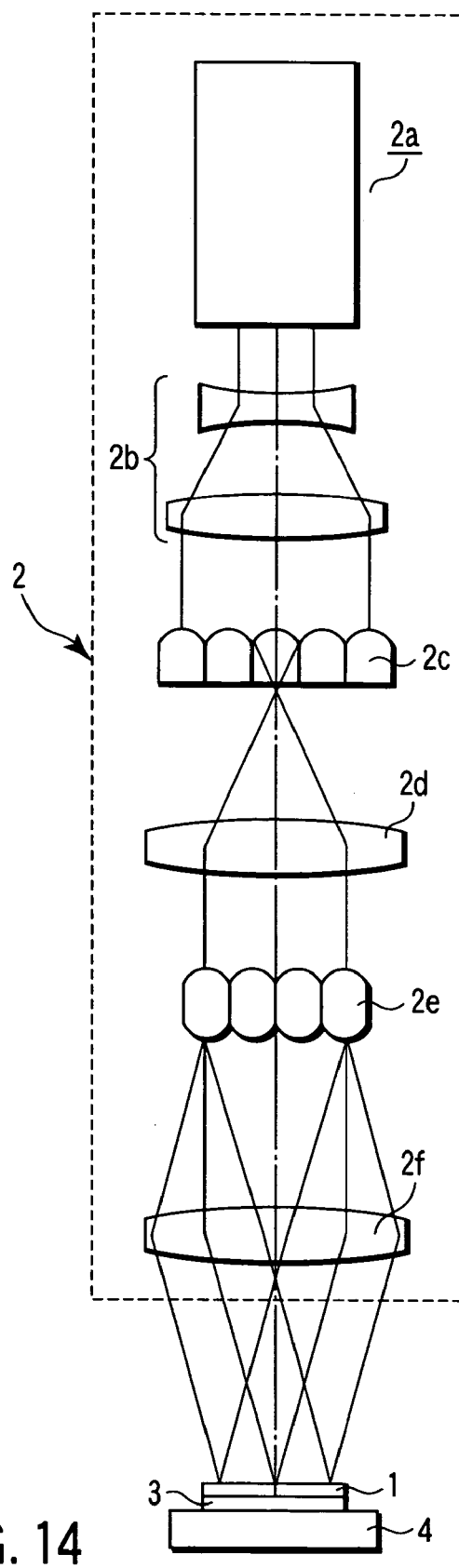
FIG. 14 is a view schematically showing a structure of a crystallization apparatus according to a second embodiment of the present invention.

A structure of a crystallization apparatus according to a second embodiment of the present invention will now be described with reference to FIG. 14. Although the second embodiment has a structure similar to that of the first embodiment, the second embodiment is basically different from the first embodiment in that the light outgoing radiation plane of the mask 1 and the light incident plane of the processed substrate 3 are arranged in contact with each other. As described above, in the first embodiment according to a so-called defocus method, it is possible to use the light absorption type mask 1, the light scattering type mask 11, the light reflection type mask 21, the light refraction type mask 31 and the light diffraction type mask 41.

On the contrary, in the second embodiment according to a contact method, it is possible to employ the light absorption type mask 1, the light scattering type mask 11 and the light reflection type mask 21, but the light refraction type mask 31 and the light diffraction type mask 41 cannot be used. Further, as described above, when the forward scattered light reaches the processed substrate and forms the noise, the light scattering type mask 11 can be used in the second embodiment.

Figure 15:
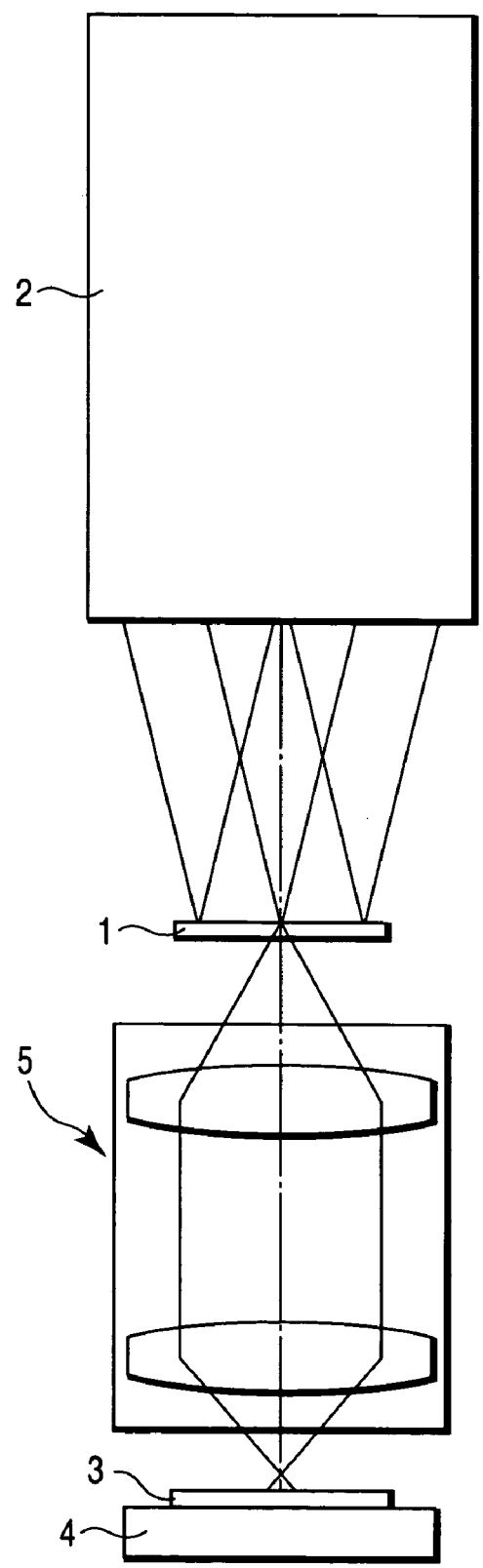
FIG. 15 is a view schematically showing a structure of a crystallization apparatus according to a third embodiment of the present invention.

A structure of a crystallization apparatus according to a third embodiment of the present invention will now be described with reference to FIG. 15. Although the third embodiment has a structure similar to that of the first embodiment, the third embodiment is basically different from the first embodiment in that an image forming optical system 5 is provided in a light path between the mask 1 and the processed substrate 3. In the third embodiment, as shown in FIG. 15, the processed substrate 3 is set away from a surface (image plane of the image forming optical system 5) optically conjugate with the mask 1 by a predetermined distance on an optical axis. This image forming optical system 5 may be a refraction type optical system, a reflection type optical system or a refraction/reflection optical system. In the third embodiment according to a so-called projection defocus method, it is possible to use the light absorption type mask 1, the light scattering type mask 11, the light reflection type mask 21, the light refraction type mask 31 and the light diffraction type mask 41 like the first embodiment.

In the first and second embodiment, it is necessary to give attention to abrasion in the processed substrate. On the contrary, in the third embodiment, the image forming optical system 5 is interposed between the mask 1 and the processed substrate 3. Thus, a relatively large gap is assured between the processed substrate 3 and the image forming optical system 5. Accordingly, the excellent crystallization can be realized without being affected by abrasion in the processed substrate.

In the third embodiment, since a relatively large gap may be assured between the processed substrate 3 and the image forming optical system 5, it is easy to lead a detection light beam used to detect a position into a light path between these members and adjust a positional relationship between the processed substrate 4 and the image forming optical system 5.

Figure 16:
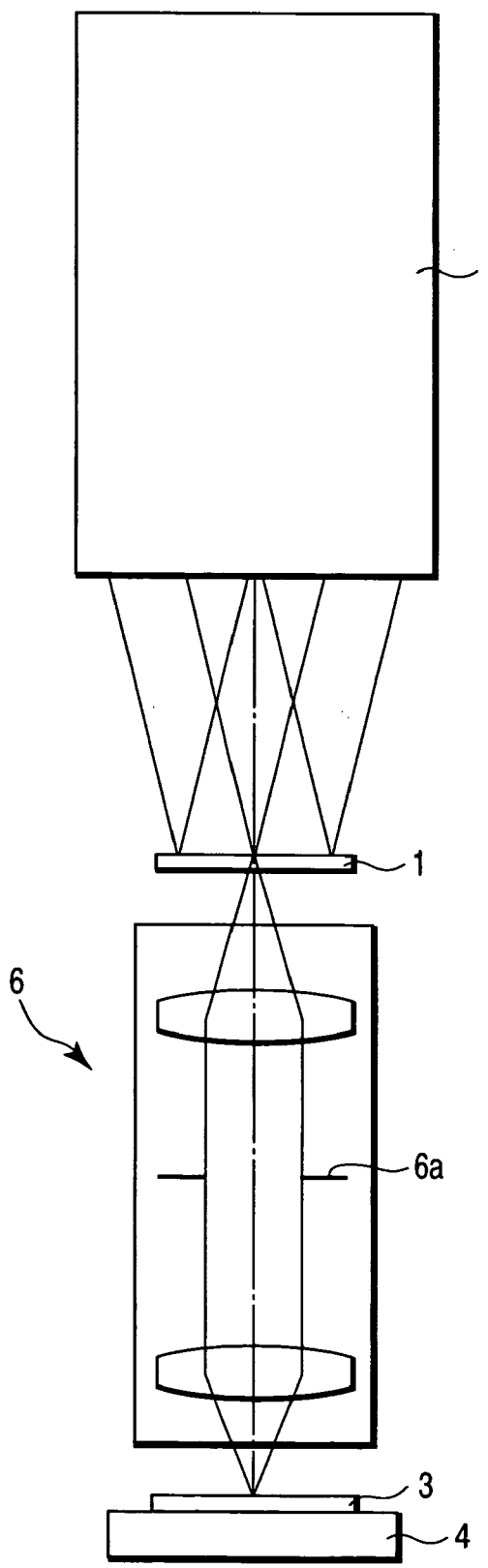
FIG. 16 is a view schematically showing a structure of a crystallization apparatus according to a fourth embodiment of the present invention.

FIG. 16 schematically shows a structure of a crystallization apparatus according to a fourth embodiment of the invention. Although the fourth embodiment has a structure similar to that of the third embodiment, the fourth embodiment is basically different from the third embodiment in that the mask 1 and the processed substrate 3 are arranged so as to be optically conjugate through the image forming optical system 6. Paying attention to the difference from the third embodiment, the fourth embodiment will now be described.

In the fourth embodiment, the image forming optical system 6 has an aperture diaphragm 6a arranged on its pupil plane. The aperture diaphragm 6a is selected as one of a plurality of aperture diaphragms having different aperture portions (light transmission portions), and a plurality of the aperture diaphragms are constituted so as to be capable of being switched with respect to the light path. Alternatively, the aperture diaphragm 6a has one iris diaphragm which can continuously change a size of an aperture portion. In both cases, a size of the aperture of the aperture diaphragm 6a (namely, an image side numerical aperture of the image forming optical system 6) is set so as to generate a necessary light intensity distribution with an inverse peak pattern on a semiconductor film of the processed substrate 3.

In the fourth embodiment according to a so-called projection NA method, it is possible to use the light absorption type mask 1, the light scattering type mask 11, the light reflection type mask 21, the light refraction type mask 31 and the light diffraction type mask 41 like the first and third embodiments. Furthermore, in the fourth embodiment, the excellent crystallization can be realized without being affected by abrasion in the processed substrate 3, and a positional relationship between the processed substrate 3 and the image forming optical system 6 can be adjusted like the third embodiment.

A crystallization apparatus according to a fifth embodiment of the present invention will now be described with reference to FIG. 17. Although the fifth embodiment has a structure similar to that of the first embodiment, the fifth embodiment is basically different from the first embodiment in that the mask 51 has two function layers. As shown in FIG. 17, the basic unit part 51a of the mask 51 includes a light refraction layer 51b having light refraction characteristics according to a desired light intensity distribution with an inverse peak pattern, and a light absorption layer 51c having light absorption characteristics according to a desired light intensity distribution with an inverse peak pattern.

Here, the light refraction layer 51b arranged with a predetermined gap from the surface 3a of the processed substrate forms on the surface 3a a light intensity distribution with a gentle inverse peak pattern (concave pattern) like a curved line indicated by a broken line 51bb in the figure. On the other hand, the light absorption layer 51c arranged in close proximity to (or appressed against) the surface 3a of the processed substrate forms on the surface 3a a light intensity distribution with an inverse peak which is steeper than that obtained by the light refraction layer 51b, As a result, in the fifth embodiment using the mask 51, a light intensity distribution with a two-stage inverse peak pattern can be obtained on the surface 3a of the processed substrate like a curved line indicated by a solid line 51bc in FIG. 17 by a combination of the effect of the light refraction layer 51b and the effect of the light absorption layer 51c. In the light intensity distribution with the two-stage inverse peak pattern shown in FIG. 17, after the light intensity is suddenly increased from a position where the light intensity is 0 or minimum toward the laterally and reaches a predetermined value, the light intensity is further substantially monotonously increased in a lateral direction. At the position where the light intensity is substantially 0 or minimum, although not a must, it is desirable to set the light intensity in such a manner that a temperature of the surface 3a becomes not more than a fusing point of a substance forming this surface, e.g., amorphous silicon. In the fifth embodiment, a crystal nucleus or nuclei are formed in the vicinity of a position or positions where the light intensity is minimum in the light intensity distribution with the two-stage inverse peak pattern. Subsequently, a lateral growth starts from the crystal nucleus toward the periphery along a direction that a light intensity gradient (in other words, a temperature gradient) is large. At this time, in the light intensity distribution with the two-stage inverse peak pattern which can be obtained by the mask according to the present invention, a part where the light intensity is decreased does not substantially exist in the middle portion, as different from the prior art. Thus, a growth of a large crystal grain can be realized without stopping the lateral growth in mid course.

When trying to obtain such a light intensity distribution with the two-stage inverse peak pattern by only the light absorption layer 51c, a change in film thickness of the light absorption layer 51c becomes large. However, there is an advantage that a film thickness distribution of the light absorption layer 51c is no longer necessary or very small, since a combination of the two function layers is utilized in the fifth embodiment. Likewise, when trying to obtain the light intensity distribution with the two-stage inverse peak pattern by only the light refraction layer 51b, a surface shape or a refractive index distribution of the light refraction layer 51b becomes very complicated. However, forming the light intensity distribution with the concave pattern by the light refraction layer 51b can suffice since the combination of the two function layers is utilized, and a relatively simple surface shape or refractive index distribution is enough.

In the fifth embodiment, although the mask 51 having the light refraction layer 51b and the light absorption layer 51c is used, the present invention is not restricted to this combination of the function layers. It is possible to use a mask having two or more any different function layers or two or more any equal function layers. Specifically, as the first and second function layers constituting the mask, arbitrary function layers can be selected from the light absorption layer, the light scattering layer, the light reflection layer, the light refraction layer and the light diffraction layer.

Figure 22:
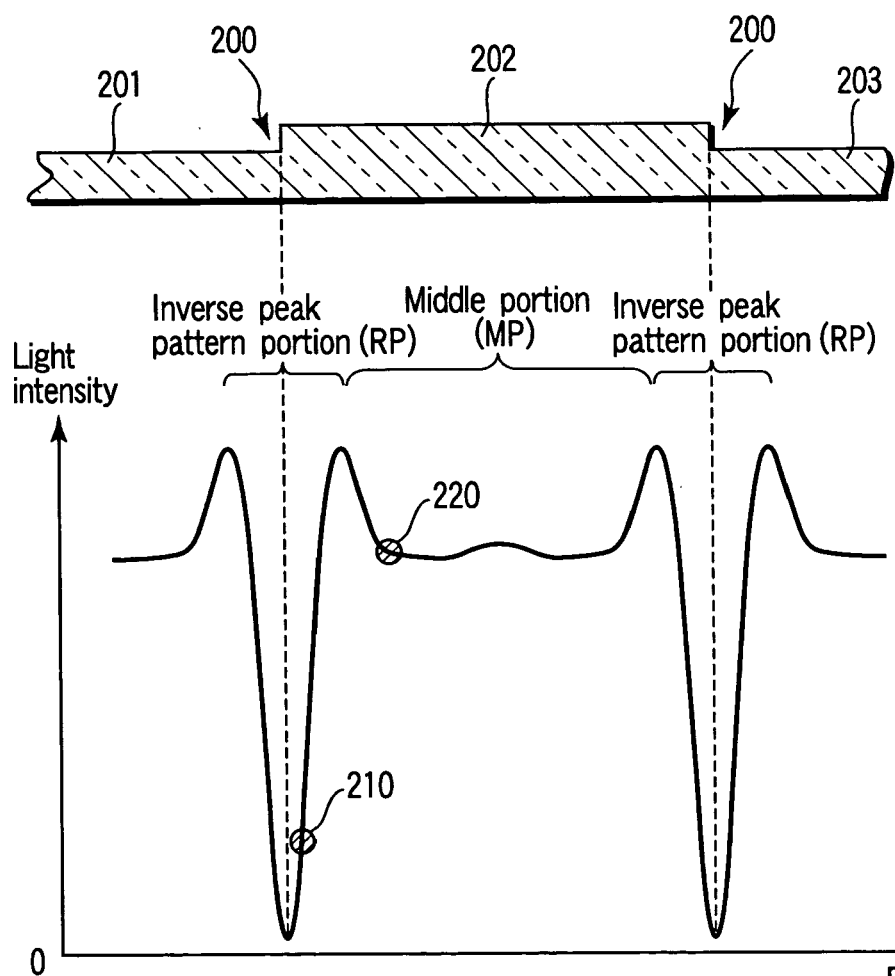
FIG. 22 is a view showing a light intensity distribution obtained on a processed substrate when a conventional line type phase shift mask is used.

Although the light refraction layer 51b and the light absorption layer 51c are arranged with a gap therebetween in the fifth embodiment, the present invention is not restricted thereto. The two function layers may be formed or arranged integrally or without a gap therebetween. As to the arrangement of the two function layers, various modifications can be carried out. Specifically, when giving, e.g., a refraction surface to a light absorption material, the light absorption layer and the light refraction layer are integrally formed. Further, when giving, e.g., a phase shift plane to the light absorption material, the light absorption layer and the phase shift layer are integrally formed. FIG. 17A shows this example. This mask 100 is formed by using a phase shifter 100a such as shown in FIG. 22 as a transparent substrate and attaching a light absorption layer 100c such as shown in FIG. 2 as a function layer to the light outgoing radiation plane. Here, the function layer is not restricted to the light absorption layer, and it can be understood by a person skilled in the art that the function layer can be selected from the light absorption layer having light absorption characteristics according to a light intensity distribution with an inverse peak pattern, the scattering layer, the light reflection layer, the light refraction layer and the light diffraction layer.

Furthermore, it can be understood that any of the function layer and the phase shifter may be arranged on the light incident side.

Although the present invention is applied to the crystallization apparatus and method according to the defocus method in the fifth embodiment, the present invention is not restricted thereto. The present invention can be also applied to the crystallization apparatus and method according to a contact method, a projection defocus method or a projection NA method.

Figure 18A:
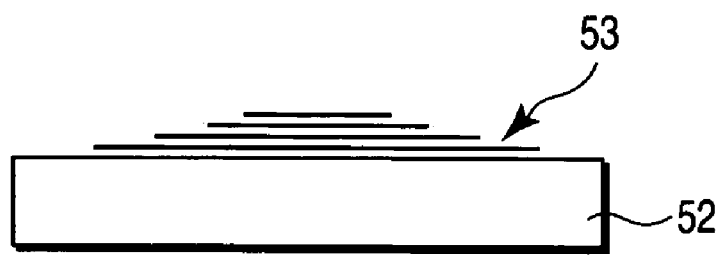
FIGS. 18A to 18C are views illustrating an example of a manufacturing method of a mask integrally constituted by a light reflection layer and a light absorption layer and a usage embodiment.
Figure 18B:
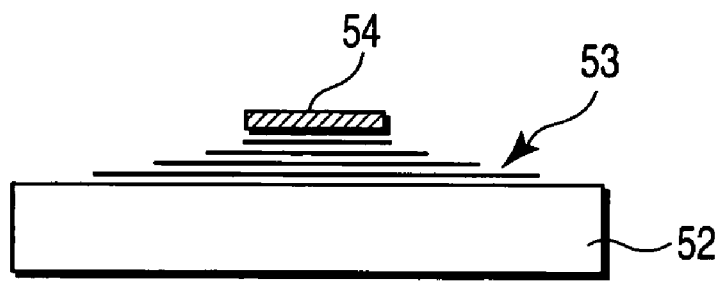

An example of a manufacturing method of a mask in which a light reflection layer and a light absorption layer are integrally constituted and a usage embodiment will now be described with reference to FIGS. 18A to 18C. In this manufacture embodiment, a light reflection layer 53 consisting of a multilayer reflection film having a predetermined layer number distribution was formed on, e.g., a quartz glass substrate 52 as shown in FIG. 18A by the method described in connection with the second modification of the first embodiment. Subsequently, a chrome layer was formed on a thickest area of the light reflection layer 53 by sputtering, and resist application, exposure, development and etching were carried out, thereby forming a light absorption layer 54 consisting of a chrome pattern as shown in FIG. 18B.

Figure 18C:
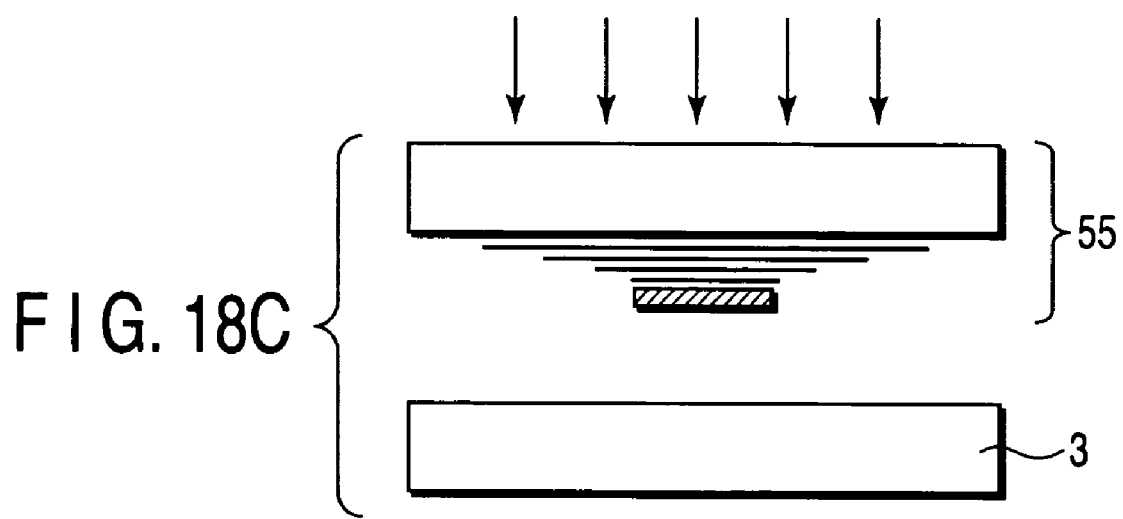

The manufactured mask 55 was held at a position in contact with the processed substrate 3 or held at a position away from the processed substrate 3 by a predetermined distance as shown in FIG. 18C. Then, the mask 55 was illuminated with an XeCl excimer laser beam (wavelength: 308 nm) as indicated by an arrow from a substantially vertical direction. As a result, a desired light intensity distribution with a two-stage inverse peak pattern was formed, and a crystal with a large particle size was generated. Here, the light reflection layer 53 has a function to form a light intensity distribution with a gentle inverse peak pattern (concave pattern). The light absorption layer 54 has a function to form a light intensity distribution with a steep inverse peak pattern.

A mask used in a crystallization apparatus according to a sixth embodiment of the present invention and its effect will now be described with reference to FIGS. 19A to 19DC. The sixth embodiment has a structure similar to that of the first embodiment, but the sixth embodiment is basically different from the first embodiment in that a mask 61 has binary distribution characteristics. In a basic unit part 61a of the mask 61 according to the sixth embodiment, many small light absorption unit areas 61c are discretely formed on, e.g., a quartz glass substrate 61b according to a predetermined dot distribution. In this example, the light absorption unit area 61c has a circular shape, and a gap between the areas becomes wider toward the outer side in the lateral direction (horizontal direction in FIG. 19D) and even in the lengthwise direction.

The shape and the distribution of the light absorption unit area 61c are not restricted to the above structure. They can be arbitrarily set in accordance with a necessary light intensity pattern. For example, as shown in FIG. 19E, the light absorption unit area 61c may have an elongated layer shape.

Figure 19A:
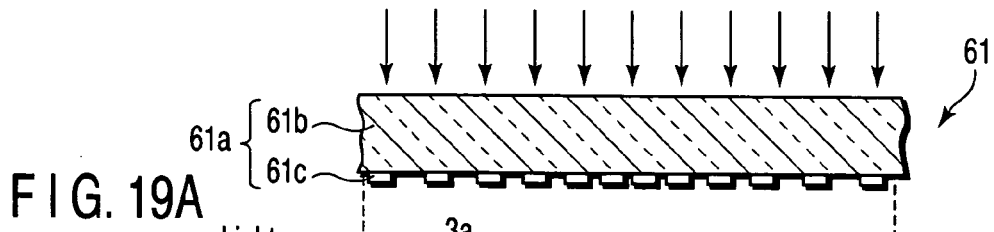
FIGS. 19A to 19D are views schematically showing a mask of a crystallization apparatus according to a sixth embodiment of the present invention and a light intensity distribution of an outgoing light beam from this mask.
Figure 19B:
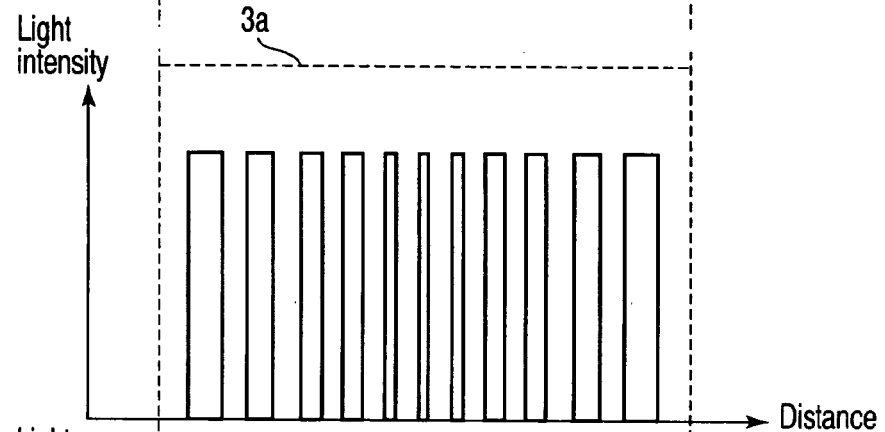
Figure 19C:
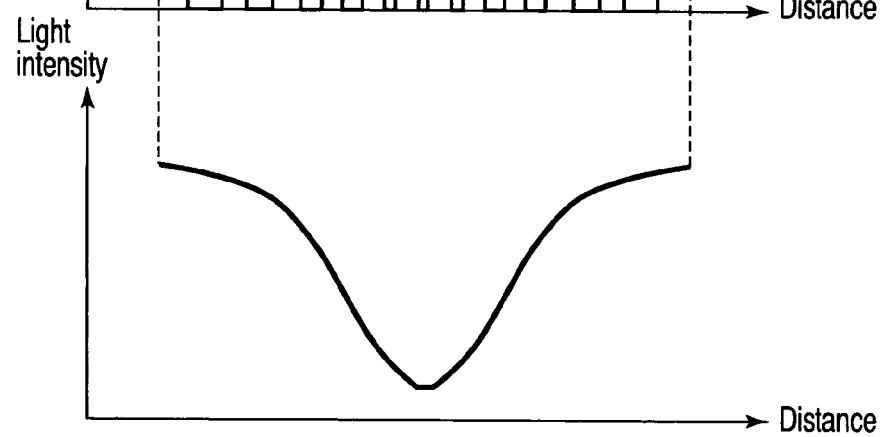
Figure 19D:
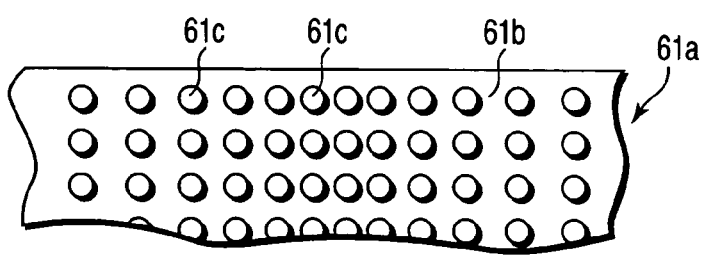
Figure 19E:
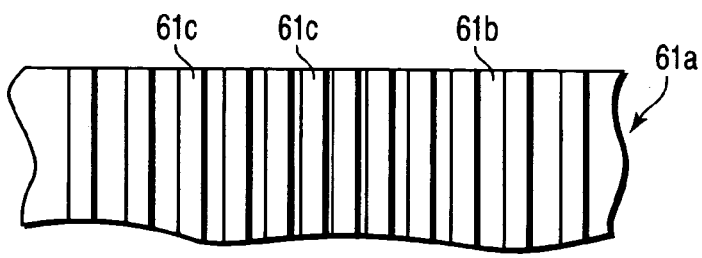
FIG. 19E is a plan view showing a modification of the mask.

As shown in FIG. 19B, a strip-like discontinuous light intensity distribution can be obtained on the outgoing radiation plane of the mask 61 having the above structure. However, a light intensity distribution with a relatively continuous inverse peak pattern can be obtained on the surface 3a of the processed substrate away from the outgoing radiation plane of the mask 61 with a gap therebetween by removing a high-frequency component of a spatial frequency by utilizing the defocus as show in FIG. 19C.

Although the small light absorption unit areas 61c formed in accordance with a predetermined distribution are used in the sixth embodiment, the present invention is not restricted thereto. It is also possible to use, e.g., small light scattering unit areas or light reflection unit areas formed in accordance with a predetermined distribution (however, small light refraction unit areas or small light diffraction unit areas cannot be used). That is, in general, a continuous light intensity distribution can be obtained by using a mask having a binary structure in place with distribution characteristics continuous in terms of a material or a structure, and cutting (removing) a high-frequency component of a spatial frequency. In this case, difficult processing to realize a distribution continuous in terms of a material or a structure is no longer necessary.

Although the high-frequency component is removed by separating the outgoing radiation plane of the mask 61 from the surface 3a of the processed substrate in the sixth embodiment, the present invention is not restricted thereto. The high-frequency component can be removed by separating the processed substrate from a surface which is optically conjugate with the mask through the image forming optical system arranged in the light path between the processed substrate and the mask, for example. Specifically, for example, in the apparatus shown in FIG. 15, using the mask 61 according to this embodiment as the mask 1 can suffice. Moreover, in the defocus method or the projection defocus method in particular, the high-frequency component can be also removed by illuminating the mask with a non-parallel light flux having a predetermined maximum incident angle.

Additionally, the high-frequency component can be also removed by arranging the processed substrate and the mask so as to be optically substantially conjugate with each other through the image forming optical system, and setting an image side numerical aperture of the image forming optical system to a necessary value. Further, by giving a necessary aberration to the image forming optical system arranged in the light path between the processed substrate and the mask.

A brief description will now be given as to a case that the high-frequency component is removed by setting the image side numeral aperture of the image forming optical system to a necessary value. A complex amplitude distribution I (u, v) of an image through the image forming optical system can be represented by a convolution integral of a complex amplitude distribution O (u, v) of an object (mask) and a complex amplitude distribution of a point image (point spread function) ASF (u, v) as indicated by the following expression (4). It is to be noted that "∫" is an integral symbol in the expression (4).

$$I(u,v) = \int\int |O(u',v')ASF(u-u',v-v')|du'dv' \quad (4)$$

Here, the point spread function ASF is given by Fourier transform of a pupil function. That is, when the image side numeral aperture of the image forming optical system is small, the point spread function has a wider distribution, and blurring of an image becomes large. This means that a high-frequency component in a spatial frequency of the object is cut, and serves as one type of high-cut filter. As a result, even if the object is a binary type, the high-frequency component is cut, thereby obtaining a continuous light intensity distribution.

An example of a manufacturing method of a mask having binary distribution characteristics and a usage embodiment will now be described with reference to FIG. 20. In this manufacture embodiment, a chrome mask is used as a mask.

That is, as shown in FIG. 20, a basic unit part 61a of a mask 61 was manufactured by forming a small chrome area 61c on a transparent substrate 61b so as to be distributed in the binary manner based on a pattern such that a numeral aperture is entirely increased as distanced from the center. In case of the chrome mask, the chrome layer 61c functions as a light absorption layer and also as a light reflection layer.

A high-frequency component was cut by applying the thus manufactured mask to the projection NA method and setting the image side numerical aperture of the image forming optical system to 0.05. As a result, a desired light intensity distribution with an inverse peak pattern (concave pattern) or a two-stage peak pattern was formed, thereby generating a crystal with a large particle size. It is to be noted that only the numeral aperture in one direction is modulated in the example of FIG. 20, but only the numerical aperture in the other direction may be modulated, or the numerical aperture may be two-dimensionally modulated along the both directions. Moreover, a density of a small aperture having a fixed size can be modulated.

In each of the foregoing embodiments, although the light intensity distribution can be calculated on a design stage, it is desirable to observe and confirm the light intensity distribution on the actual processed plane (exposed plane). Therefore, it is good enough to enlarge the processed plane by the optical system and input a result by an imaging element such as a CCD. When the light to be used is ultraviolet rays, since the optical system undergoes restriction, the light may be converted into visible light rays by providing a fluorescent screen to the processed plane.

Figure 21A:
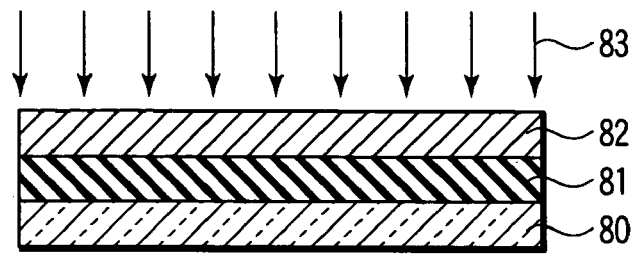
FIGS. 21A to 21E are views showing steps of an example of a method for manufacturing an electronic device by using the crystallization apparatus according to each embodiment.

An example of a method for manufacturing an electronic device by using the crystallization apparatus according to each embodiment will now be described with reference to FIGS. 21A to 21E. As shown in FIG. 21A, an underlying film 81 (e.g., SiN having a film thickness of 50 nm and an SiO$_2$ laminated film having a film thickness of 100 nm) and an amorphous semiconductor film 82 (e.g., Si, Ge, SiGe or the like having a film thickness of approximately 50 mm to 200 nm) are sequentially formed on, e.g., a rectangular insulating substrate 80 (e.g., alkali glass, quartz glass, plastic, polyimide or the like) having flat both surfaces by using a chemical vapor deposition method or a sputtering method, thereby forming the processed substrate 3. Then, a part of the upper surface or all of the upper surface of the amorphous semiconductor film 82 (corresponding to the surface 3a of the processed substrate 3) is irradiated with a laser beam 83 (e.g., a KrF excimer laser beam or an XeCl excimer laser beam) as indicated by arrows by using the crystallization apparatus according to each embodiment.

Figure 21B:
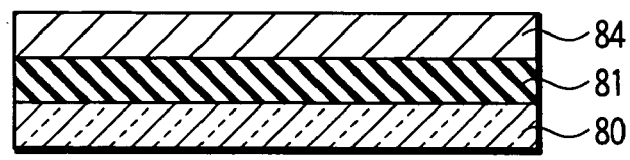
Figure 21C:
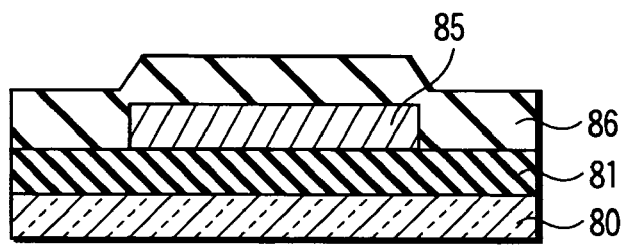
Figure 21D:
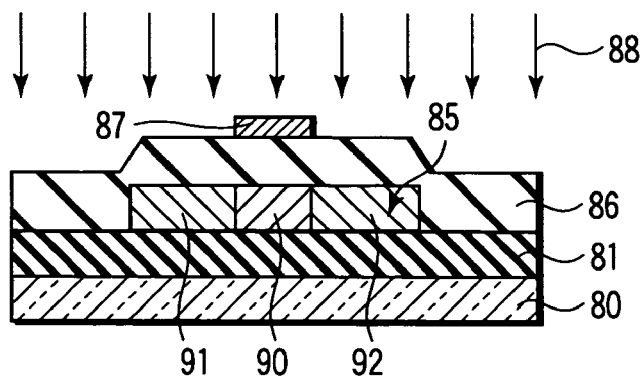

As a result, as shown in FIG. 21B, the amorphous semiconductor film 82 becomes a polycrystal semiconductor film or a monocrystal semiconductor film 84 having a crystal grain or grains with a large particle size. Then, as shown in FIG. 21C, the polycrystal semiconductor film or the monocrystal semiconductor film is processed into an island-shaped semiconductor film 85 by using the photolithography technique. Then, an SiO$_2$ film having a film thickness of 20 nm to 100 nm is formed as a gate insulating film 86 on the semiconductor film 85 and the underlying layer 81 by using the chemical vapor deposition method or the sputtering method. Additionally, as shown in FIG. 21D, a gate electrode 87 (e.g., silicide or MoW) is formed on a part opposed to the semiconductor film 85, of the gate insulating film 86. Then, impurity ions 88 (phosphor in case of an N channel transistor, boron in case of a P channel transistor) are implanted into the semiconductor layer 85 through the gate insulating film 86 as indicated by arrows with the gate electrode 87 being used as a mask. Thereafter, annealing processing (e.g., one hour at 450° C.) is carried out in a nitrogen atmosphere, the impurities in the semiconductor layer 85 are activated. Thus, a source area 91 and a drain area 92 are formed with a channel area 90 positioned below the gate electrode 87 being sandwiched therebetween.

Figure 21E:
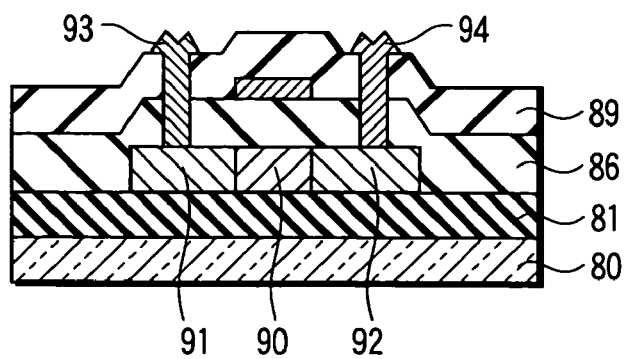

Subsequently, as shown in FIG. 21E, an interlayer insulating film 89 is formed on the gate insulating film 86 and the gate electrode 87. Next, contact holes are formed to these films 86 and 89, and a source electrode 93 and a drain electrode 94 connected to the source area 91 and the drain area 92 are formed. At this time, the channel area 90 is formed in accordance with a position of the crystal with a large particle size of the polycrystal semiconductor film or the monocrystal semiconductor film 84 formed by emitting the laser beam through the mask described in each modification, in the steps shown in FIGS. 21A and 21B. With the above-described steps, a polycrystal transistor or a monocrystal semiconductor transistor can be formed. The manufactured polycrystal transistor or monocrystal transistor can be applied to a drive circuit of, e.g., a liquid crystal display or an EL (electro luminescence) display or an integrated circuit such as a memory (SRAM or DRAM) or a CPU.

Although the present invention is applied to the crystallization apparatus and method in each of the foregoing embodiments, the present invention is not restricted thereto, and the present invention can be generally applied to a mask used to form a predetermined light intensity distribution on a predetermined plane and an exposure method used to form a predetermined light intensity distribution on a substrate set on a predetermined plane by using this mask.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A crystallization apparatus comprising:
  a mask including at least one basic unit; and
  an illumination system configured to illuminate the mask with a light beam so as to produce an outgoing light beam, the outgoing light beam emerging from the mask having an outgoing light intensity distribution with a light intensity being minimum substantially at a center of the at least one basic unit and an increasing light intensity towards a periphery of the at least one basic unit when transmitted through the mask, and configured to irradiate a polycrystalline semiconductor film or an amorphous semiconductor film, thereby generating a crystallized semiconductor film,
  wherein the mask includes a light absorption layer having light absorption characteristics so as to produce said outgoing light intensity distribution.

2. The crystallization apparatus according to claim 1, wherein the polycrystalline semiconductor film or the amorphous semiconductor film and the mask are arranged to be appressed against each other.

3. The crystallization apparatus according to claim 1, wherein the polycrystalline semiconductor film or the amorphous semiconductor film and the mask are arranged in substantially parallel and in close proximity to each other.

4. The crystallization apparatus according to claim 1, further comprising:
an image forming optical system arranged in a light path between the polycrystalline semiconductor film or the amorphous semiconductor film and the mask,
wherein the polycrystalline semiconductor film or the amorphous semiconductor film is configured to be separated from a plane which is optically conjugate with the mask by a predetermined distance on an optical axis of the image forming optical system.

5. The crystallization apparatus according to claim 1, further comprising:
an image forming optical system which is arranged in a light path between the polycrystalline semiconductor film or the amorphous semiconductor film and the mask,
wherein the polycrystalline semiconductor film or the amorphous semiconductor film is set to a plane which is optically substantially conjugate with the mask, and
an image side numerical aperture of the image forming optical system is configured to generate said outgoing light intensity distribution.

6. A crystallization apparatus comprising:
a mask including at least one basic unit; and
an illumination system configured to illuminate the mask with a light beam, the outgoing light beam emerging from the mask having an outgoing light intensity distribution with a light intensity being minimum substantially at a center of the at least one basic unit and an increasing light intensity towards a periphery of the at least one basic unit when transmitted through the mask and being incident onto, a polycrystalline semiconductor film or an amorphous semiconductor film, thereby generating a crystallized semiconductor film,
wherein the mask includes a light scattering layer having light scattering characteristics so as to produce said outgoing light intensity distribution.

7. The crystallization apparatus according to claim 6, wherein the light scattering layer has a refractive index distribution according to said outgoing light intensity distribution.

8. The crystallization apparatus according to claim 7, wherein the light scattering layer is formed by forming a layer including a transparent material in which volatile components are dispersed and then volatilizing the volatile components.

9. The crystallization apparatus according to claim 6, wherein the light scattering layer has a surface shape according to the outgoing light intensity distribution.

10. A crystallization apparatus comprising:
a mask including at least one basic unit; and
an illumination system configured to illuminate the mask with a light beam, the outgoing light beam emerging from the mask having an outgoing light intensity distribution with a light intensity being minimum substantially at a center of the at least one basic unit and an increasing light intensity towards a periphery of the at least one basic unit when transmitted through the mask, and configured to irradiate a polycrystalline semiconductor film or an amorphous semiconductor film, thereby generating a crystallized semiconductor film,
wherein the mask includes a light reflection layer having light reflection characteristics so as to produce said outgoing light intensity distribution.

11. The crystallization apparatus according to claim 10, wherein the light reflection layer includes a multilayer reflection film formed in accordance with a predetermined layer number distribution.

12. The crystallization apparatus according to claim 10, wherein the light reflection layer includes a metal reflection film formed in accordance with a predetermined thickness distribution.

13. A crystallization apparatus comprising:
a mask including at least one basic unit; and
an illumination system configured to illuminate the mask with a light beam so as to produce an outgoing light beam emerging from the mask, the outgoing light beam having an outgoing light intensity distribution with a light intensity being minimum substantially at a center of the at least one basic unit and an increasing light intensity towards a periphery of the at least one basic unit when transmitted through the mask, and configured to irradiate a polycrystalline semiconductor film or an amorphous semiconductor film, thereby generating a crystallized semiconductor film,
wherein the mask includes a light refraction layer having light refraction characteristics so as to produce said outgoing light intensity distribution.

14. The crystallization apparatus according to claim 13, wherein the light refraction layer has a refractive index distribution according to said outgoing light intensity distribution.

15. The crystallization apparatus according to claim 13, wherein the light refraction layer has a surface shape according to said outgoing light intensity distribution.

16. A crystallization apparatus comprising:
a mask including at least one basic unit; and
an illumination system configured to illuminate the mask with a light beam so as to produce an outgoing light beam emerging from the mask, the outgoing light beam having an outgoing light intensity distribution with a light intensity being minimum substantially at a center of the at least one basic unit and an increasing light intensity towards a periphery of the at least one basic unit when transmitted through the mask, and configured to irradiate a polycrystalline semiconductor film or an amorphous semiconductor film, thereby generating a crystallized semiconductor film,
wherein the mask includes a light diffraction layer having light diffraction characteristics so as to produce said outgoing light intensity distribution.

17. The crystallization apparatus according to claim 16, wherein the light diffraction layer has a refractive index distribution according to said outgoing light intensity distribution.

18. The crystallization apparatus according to claim 16, wherein the light diffraction layer has a surface shape according to said outgoing light intensity distribution.

19. A crystallization apparatus comprising:
a plurality of masks each including at least one basic unit; and
an illumination system configured to illuminate the masks with a light beam so as to produce an outgoing light beam emerging from the masks, the outgoing light beam having an outgoing light intensity distribution with a light intensity being minimum substantially at a center of the at least one basic unit and an increasing light intensity towards a periphery of the at least one basic unit when transmitted through the masks, and configured to irradiate a polycrystalline semiconductor film or an amorphous semiconductor film, thereby generating a crystallized semiconductor film, wherein the plurality of masks include, a first layer and a second layer selected from the group consisting of, a light absorption layer having light absorption characteristics so as to produce said outgoing light intensity distribution, a light scattering layer having light scattering characteristics so as to produce said outgoing light intensity distribution, a light reflection layer having light reflection characteristics so as to produce said outgoing light intensity distribution, a light refraction layer having light refraction characteristics so as to produce said outgoing light intensity distribution, and a light diffraction layer having light diffraction characteristics so as to produce said outgoing light intensity distribution.

20. A crystallization apparatus comprising:

a mask including at least one basic unit; and an illumination system configured to illuminate the mask with a light beam, the outgoing light beam emerging from the mask having an outgoing light intensity distribution with a light intensity being minimum substantially at a center of the at least one basic unit and an increasing light intensity towards a periphery of the at least one basic unit when transmitted through the mask, and configured to irradiate a polycrystalline semiconductor film or an amorphous semiconductor film, thereby generating a crystallized semiconductor film, wherein the mask comprises, a phase shift layer and a first layer selected from the group consisting of, a light absorption layer having light absorption characteristics so as to produce said outgoing light intensity distribution, a light scattering layer having light scattering characteristics so as to produce said outgoing light intensity distribution, a light reflection layer having light reflection characteristics so as to produce said outgoing light intensity distribution, a light refraction layer having light refraction characteristics so as to produce said outgoing light intensity distribution, and a light diffraction layer having light diffraction characteristics so as to produce said outgoing light intensity distribution.

21. A crystallization apparatus comprising:

a mask including at least one basic unit; and an illumination system configured to illuminate the mask with a light beam, the outgoing light beam emerging from the mask having an outgoing light intensity distribution with a light intensity being minimum substantially at a center of the at least one basic unit and an increasing light intensity towards a periphery of the at least one basic unit when transmitted through the mask, and configured to irradiate a polycrystalline semiconductor film or an amorphous semiconductor film, thereby generating a crystallized semiconductor film, wherein the mask has binary distribution characteristics so as to produce said outgoing light intensity distribution, and being configured to obtain a relatively continuous light intensity distribution by removing a high-frequency component of a spatial frequency.

22. The crystallization apparatus according to claim 21, wherein the polycrystalline semiconductor film or the amorphous semiconductor film and the mask are arranged in substantially parallel and in close proximity to each other to remove the high-frequency component.

23. The crystallization apparatus according to claim 21, further comprising:

an image forming optical system arranged in a light path between the polycrystalline semiconductor film or the amorphous semiconductor film and the mask, wherein the polycrystalline semiconductor film or the amorphous semiconductor film is set to be separated from a plane which is optically conjugate with the mask by a predetermined distance on an optical axis of the image forming optical system to remove the high-frequency component.

24. The crystallization apparatus according to claim 22, wherein the illumination system is configured to illuminate the mask with a light beam having a predetermined maximum incident angle.

25. The crystallization apparatus according to claim 21, further comprising:

an image forming optical system arranged in a light path between the polycrystalline semiconductor film or the amorphous semiconductor film and the mask, wherein the polycrystalline semiconductor film or the amorphous semiconductor film is set to a plane which is optically substantially conjugate with the mask, and the image forming optical system is set to an image side numerical aperture configured to remove the high-frequency component.

26. The crystallization apparatus according to claim 21, further comprising an image forming optical system arranged in a light path between the polycrystalline semiconductor film or the amorphous semiconductor film and the mask, and wherein the image forming optical system has an aberration configured to remove the high-frequency component.

27. A crystallization method including the steps of:

illuminating a mask having at least one basic unit, irradiating a polycrystalline semiconductor film or an amorphous semiconductor film through the mask, with an outgoing light beam emerging from the mask having an outgoing light intensity distribution with a light intensity being minimum substantially at a center of the at least one basic unit and an increasing light intensity towards a periphery of the at least one basic unit, thereby generating a crystallized semiconductor film, and using the mask with a light absorption layer having light absorption characteristics so as to produce said light intensity distribution.

28. A crystallization method including the steps of:

illuminating a mask having at least one basic unit, irradiating a polycrystalline semiconductor film or an amorphous semiconductor film through the mask, with an outgoing light beam emerging from the mask having an outgoing light intensity distribution with a light intensity being minimum substantially at a center of the at least one basic unit and an increasing light intensity towards a periphery of the at least one basic unit, thereby generating a crystallized semiconductor film, and using the mask with a light scattering layer having light scattering characteristics so as to produce said light intensity distribution.

29. A crystallization method including the steps of:
illuminating a mask having at least one basic unit,
irradiating a polycrystalline semiconductor film or an amorphous semiconductor film through the mask, with an outgoing light ray emerging from the mask having an outgoing light intensity distribution with a light intensity being minimum substantially at a center of the at least one basic unit and an increasing light intensity towards a periphery of the at least one basic unit, thereby generating a crystallized semiconductor film, and
using the mask with a light reflection layer having light reflection characteristics so as to produce said light intensity distribution.

30. A crystallization method including the steps of:
illuminating a mask having at least one basic unit,
irradiating a polycrystalline semiconductor film or an amorphous semiconductor film through the mask, with an outgoing light beam emerging from the mask having an outgoing light intensity distribution with a light intensity being minimum substantially at a center of the at least one basic unit and an increasing light intensity towards a periphery of the at least one basic unit, thereby generating a crystallized semiconductor film, and
using the mask with a light refraction layer having light refraction characteristics so as to produce said light intensity distribution.

31. A crystallization method including the steps of:
illuminating a mask having at least one basic unit,
irradiating a polycrystalline semiconductor film or an amorphous semiconductor film through the mask, with an outgoing light beam emerging from the mask having an outgoing light intensity distribution with a light intensity being minimum substantially at a center of the at least one basic unit and an increasing light intensity towards a periphery of the at least one basic unit, thereby generating a crystallized semiconductor film, and
using the mask with a light diffraction layer having light diffraction characteristics so as to produce said light intensity distribution.

32. A crystallization method including the steps of:
illuminating a mask having at least one basic unit,
irradiating a polycrystalline semiconductor film or an amorphous semiconductor film through the mask, with an outgoing light beam emerging from said mask having an outgoing light intensity distribution with a light intensity being minimum substantially at a center of the at least one basic unit and an increasing light intensity towards a periphery of the at least one basic unit, thereby generating a crystallized semiconductor film, and
using the mask with a first layer and a second layer, respectively, formed by layers selected from the group consisting of,
a light absorption layer having light absorption characteristics so as to produce said light intensity distribution,
a light scattering layer having light scattering characteristics so as to produce said light intensity distribution,
a light reflection layer having light reflection characteristics so as to produce said light intensity distribution,
a light refraction layer having light refraction characteristics so as to produce said light intensity distribution, and
a light diffraction layer having light diffraction characteristics so as to produce said light intensity distribution.

33. A crystallization method including the steps of:
illuminating a mask having at least one basic unit,
irradiating a polycrystalline semiconductor film or an amorphous semiconductor film through the mask, with an outgoing light beam emerging from said mask having an outgoing light intensity distribution with a light intensity being minimum substantially at a center of the at least one basic unit and an increasing light intensity towards a periphery of the at least one basic unit, thereby generating a crystallized semiconductor film, and
using the mask with a phase shift layer and a first layer which is selected from the group consisting of:
a light absorption layer having light absorption characteristics so as to produce said light intensity distribution,
a light scattering layer having light scattering characteristics so as to produce said light intensity distribution,
a light reflection layer having light reflection characteristics so as to produce said light intensity distribution,
a light refraction layer having light refraction characteristics so as to produce said light intensity distribution, and
a light diffraction layer having light diffraction characteristics so as to produce said light intensity distribution.

34. A crystallization method including the steps of:
illuminating a mask having at least one basic unit,
irradiating a polycrystalline semiconductor film or an amorphous semiconductor film through the mask, with an outgoing light beam emerging from said mask, having an outgoing light intensity distribution with a light intensity being minimum substantially at a center of the at least one basic unit and an increasing light intensity towards a periphery of the at least one basic unit, thereby generating a crystallized semiconductor film, and
removing a high-frequency component of a spatial frequency by using the mask having binary distribution characteristics so as to produce the light intensity distribution, thereby obtaining a relatively continuous light intensity distribution.

35. A mask used to form a predetermined light intensity distribution by an outgoing light beam emerging from said mask on a predetermined plane, when illuminated by a light beam,
the mask comprising a light absorption layer including at least one basic unit having light absorption characteristics so as to produce the predetermined light intensity distribution with a light intensity being minimum substantially at a center of the at least one basic unit and an increasing light intensity towards a periphery of the at least one basic unit.

36. A mask used to form a predetermined light intensity distribution by an outgoing light beam emerging from said mask on a predetermined plane, when illuminated by a light beam,
the mask comprising a light scattering layer including at least one basic unit having light scattering characteristics so as to produce the predetermined light intensity distribution with a light intensity being minimum substantially at a center of the at least one basic unit and an increasing light intensity towards a periphery of the at least one basic unit.

37. A mask used to form a predetermined light intensity distribution by an outgoing light beam emerging from said mask on a predetermined plane, when illuminated by a light beam, the mask comprising a light reflection layer including at least one basic unit having light reflection characteristics so as to produce the predetermined light intensity distribution with a light intensity being minimum substantially at a center of the at least one basic unit and an increasing light intensity towards a periphery of the at least one basic unit.

38. A mask used to form a predetermined light intensity distribution by an outgoing light beam emerging from said mask on a predetermined plane, when illuminated by a light beam, the mask comprising a light refraction layer including at least one basic unit having light refraction characteristics so as to produce the predetermined light intensity distribution with a light intensity being minimum substantially at a center of the at least one basic unit and an increasing light intensity towards a periphery of the at least one basic unit.

39. A mask used to form a predetermined light intensity distribution by an outgoing light beam emerging from said mask on a predetermined plane, when illuminated by a light beam, the mask comprising a light diffraction layer including at least one basic unit having light diffraction characteristics so as to produce the predetermined light intensity distribution with a light intensity being minimum substantially at a center of the at least one basic unit and an increasing light intensity towards a periphery of the at least one basic unit.

40. An exposure method comprising an illumination system which illuminates a mask as defined in claim 35, comprising the steps of:

forming the predetermined light intensity distribution on a substrate, and processing the substrate in the predetermined plane.

41. The exposure method according to claim 40, wherein the substrate and the mask are arranged to be contact with each other.

42. The exposure method according to claim 40, wherein the substrate and the mask are arranged s0u0bstantially parallel and in close proximity to each other.

43. The exposure method according to claim 40, wherein an image forming optical system is arranged in a light path between the substrate and the mask, and the substrate is set to be separated from a plane which is optically conjugate with the mask by a predetermined distance on an optical axis of the image forming optical system.

44. The exposure method according to claim 40, wherein an image forming optical system is arranged in a light path between the substrate and the mask, an image side numerical aperture of the image forming optical system is configured to generate the predetermined light intensity distribution, and the substrate is set to a surface which is optically substantially conjugate with the mask.

* * * * *